(12) United States Patent
Satoh et al.

(10) Patent No.: US 8,991,022 B2
(45) Date of Patent: Mar. 31, 2015

(54) METHOD FOR MANUFACTURING PIEZOELECTRIC RESONATOR DEVICE

(75) Inventors: Syunsuke Satoh, Kakogawa (JP); Naoki Kohda, Kakogawa (JP)

(73) Assignee: Daishinku Corporation, Kakogawa-shi (JP)

( * ) Notice: Subject to any disclaimer, the term of this patent is extended or adjusted under 35 U.S.C. 154(b) by 883 days.

(21) Appl. No.: 13/142,877

(22) PCT Filed: Jan. 7, 2010

(86) PCT No.: PCT/JP2010/050097
§ 371 (c)(1),
(2), (4) Date: Jun. 30, 2011

(87) PCT Pub. No.: WO2010/079803
PCT Pub. Date: Jul. 15, 2010

(65) Prior Publication Data
US 2011/0265298 A1    Nov. 3, 2011

(30) Foreign Application Priority Data
Jan. 7, 2009    (JP) .................................. 2009-001796

(51) Int. Cl.
*H04R 17/00*    (2006.01)
*H03H 9/10*    (2006.01)

(52) U.S. Cl.
CPC .................................. *H03H 9/1035* (2013.01)
USPC ........... 29/25.35; 29/594; 29/609.1; 310/344; 310/320; 310/366; 310/348; 333/150; 333/187; 333/193; 333/195; 333/196

(58) Field of Classification Search
CPC ............. H01L 41/042; H01L 41/0474; H01L 41/0475; H01L 41/053; H01L 41/08; H01L 41/083; H01L 41/22; H01L 41/33; H01L 41/335; H01L 41/35; H03H 3/02; H03H 3/06; H03H 3/08; H03H 9/15; H03H 9/178; H03H 9/205; H03H 9/0595; H03H 9/21
USPC ............. 29/25.35, 594, 595, 609.1, 834, 835; 310/313, 320, 366, 344, 348; 333/150, 333/187, 193, 195, 196
See application file for complete search history.

(56) References Cited

U.S. PATENT DOCUMENTS 7,067,964 B1 *   6/2006   Kosinski ....................... 310/348
2006/0055013 A1 *   3/2006   Ito et al. ....................... 257/678
(Continued)

FOREIGN PATENT DOCUMENTS

JP    H10-209799 A    8/1998
JP    2003-264444 A    9/2003
(Continued)

*Primary Examiner* — Paul D Kim
(74) *Attorney, Agent, or Firm* — Marvin A. Motsenbocker; Mots Law, PLLC

(57) ABSTRACT

A method for manufacturing piezoelectric resonator devices according to the present invention includes the following steps: a wafer forming step of preparing a thick-walled wafer 30 integrally formed with multiple lower lid members 3; a bonding step of bonding crystal resonator plates 2 to one main surface 31 of the wafer 30 via a bonding material 5 and bonding upper lid members 4 on the crystal resonator plates via a bonding material 5; a thinning step of thinning the wafer 30 from the other main surface 37 of the wafer; an external terminal forming step of forming external terminals on the other main surface of the thinned wafer; and a dividing step of cutting the wafer between each adjacent pair of crystal resonators so that multiple crystal resonators are obtained.

3 Claims, 33 Drawing Sheets

(56) References Cited

U.S. PATENT DOCUMENTS

| | | | |
|---|---|---|---|
| 2009/0218698 A1* | 9/2009 | Lam | 257/773 |
| 2011/0215678 A1* | 9/2011 | Kohda et al. | 310/344 |

FOREIGN PATENT DOCUMENTS

| | | |
|---|---|---|
| JP | 2006-180169 A | 7/2006 |
| JP | 2006-186463 A | 7/2006 |
| JP | 2006-351591 A | 12/2006 |
| JP | 2007-013628 A | 1/2007 |
| JP | 2008-22090 A | 1/2008 |
| JP | 2008-098712 A | 4/2008 |
| JP | 2008-206002 A | 9/2008 |
| JP | 2008-219943 A | 9/2008 |
| JP | 2008-236741 A | 10/2008 |
| JP | 2008-289055 A | 11/2008 |

* cited by examiner

METHOD FOR MANUFACTURING PIEZOELECTRIC RESONATOR DEVICE

TECHNICAL FIELD

The present invention relates to a method for manufacturing piezoelectric resonator devices used in electronic equipment or the like.

BACKGROUND ART

Piezoelectric resonator devices used in electronic equipment or the like have become more and more microminiaturized and thinner in recent years. In order to improve production efficiency of piezoelectric resonator devices, a manufacturing method has been proposed in which constituent members of piezoelectric resonator devices are handled not in units of a single (individual) piezoelectric resonator device, but in units of a wafer that is integrally formed with constituent members of a large number of piezoelectric resonator devices, and multiple constituent members are bonded to one another in the wafer state and then divided into pieces so that a large number of piezoelectric resonator devices are simultaneously and collectively obtained (see Patent Document 1, for example).

PRIOR ART DOCUMENT

Patent Document

[Patent Document 1] JP 2006-180169A

SUMMARY OF INVENTION

Problem to be Solved by the Invention

A resonator (piezoelectric resonator device) disclosed in Patent Document 1 is constituted by bonding two glass wafers to respective front and back main surfaces of a crystal wafer having excitation electrodes formed thereon. The crystal wafer is handled in the form of a wafer, the glass wafers that serve as lid members are handled in the form of a wafer, and the excitation electrodes of the crystal wafer are hermetically sealed by the two glass wafers. This enables the resonator to be handled without problems such as chipping. The resonator is thinned by cutting away non-bonded surfaces of the two glass wafers that are bonded to the crystal wafer. However, with such a resonator, the number of manufacturing steps increases because of the need to thin the main surfaces of the two glass wafers serving as non-bonded surfaces. On the other hand, problems such as chipping can be prevented with a configuration (manufacturing method) in which a piezoelectric resonator plate having excitation electrodes formed thereon is formed in the form of a wafer, and individual glass wafer pieces serving as lid members are bonded to the top and the bottom of the wafer. However, with this configuration (manufacturing method), the outer dimensions of the glass wafers serving as the lid members are very small, and therefore, it is difficult to form external terminals for connecting external devices on the glass wafers.

The present invention has been conceived in light of the above problems, and it is an object of the present invention to provide a method for manufacturing piezoelectric resonator devices that allows for a reduction in profile and offers excellent production efficiency.

Means for Solving the Problems

In order to achieve the above object, a method for manufacturing a piezoelectric resonator device according to the present invention is a method for manufacturing a piezoelectric resonator device including a piezoelectric resonator plate having an excitation electrode formed thereon, and upper and lower lid members that hermetically seal the excitation electrode, the piezoelectric resonator plate and the upper lid member being bonded to each other via a bonding material, and the piezoelectric resonator plate and the lower lid member being bonded to each other via a bonding material. The manufacturing method includes a wafer forming step of preparing a thick-walled wafer that is integrally formed with a plurality of the lower lid members, a bonding step of bonding the piezoelectric resonator plates to one main surfaces of the lower lid members of the wafer and bonding the upper lid members to the piezoelectric resonator plates, a thinning step of thinning the wafer from the other main surface side of the wafer, an external terminal forming step of forming external terminals on the other main surface of the wafer, which has been thinned in the thinning step, the external terminals being electrically connected to the excitation electrodes, and a dividing step of cutting the wafer between each adjacent pair of the piezoelectric resonator devices so that a plurality of the piezoelectric resonator devices are obtained.

With the manufacturing method, it is possible to efficiently manufacture the piezoelectric resonator devices, each including the lower lid member having the external terminals formed thereon for connection to external devices. Specifically, the wafer integrally formed with a plurality of the lower lid members is thick walled, so that the piezoelectric resonator plates and the upper lid members can be bonded to the wafer with the wafer having favorable mechanical strength. Furthermore, the wafer is thinned from the underside (the other main surface side) after the bonding step, and therefore the thicknesses of the lower lid members can be simultaneously and collectively adjusted. Then, after the external terminals are collectively formed on the thinned lower lid members, the wafer is cut between each adjacent pair of the piezoelectric resonator devices. This enables efficient manufacture of a large number of piezoelectric resonator devices.

Furthermore, in order to achieve the above object, a method for manufacturing a piezoelectric resonator device according to the present invention is a method for manufacturing a piezoelectric resonator device including a piezoelectric resonator plate having an excitation electrode formed thereon, and upper and lower lid members that hermetically seal the excitation electrode, the upper lid member and the lower lid member being bonded to each other via a bonding material. The manufacturing method includes a wafer forming step of preparing a thick-walled wafer that is integrally formed with a plurality of the lower lid members, a bonding step of bonding the piezoelectric resonator plates to one main surfaces of the lower lid members of the wafer and bonding the upper lid members to the lower lid members, a thinning step of thinning the wafer from the other main surface side of the wafer, an external terminal forming step of forming external terminals on the other main surface of the wafer, which has been thinned in the thinning step, the external terminals being electrically connected to the excitation electrodes, and a dividing step of cutting the wafer between each adjacent pair of the piezoelectric resonator devices so that a plurality of the piezoelectric resonator devices are obtained.

With the manufacturing method, it is possible to efficiently manufacture the piezoelectric resonator devices, each including the lower lid member having the external terminals formed thereon for connection to external devices. Specifically, the wafer integrally formed with a plurality of the lower lid members is thick walled, so that the piezoelectric resonator plates and the upper lid members can be bonded to the wafer with the wafer having favorable mechanical strength. Furthermore, the wafer is thinned from the underside (the other main surface side) after the bonding step, and therefore the thicknesses of the lower lid members can be simultaneously and collectively adjusted. Then, after the external terminals are collectively formed on the thinned lower lid members, the wafer is cut between each adjacent pair of the piezoelectric resonator devices. This enables efficient manufacture of a large number of piezoelectric resonator devices.

The method for manufacturing piezoelectric resonator devices in which the piezoelectric resonator plates are hermetically sealed by the upper lid members and the lower lid members includes the wafer forming step, the bonding step, the thinning step, the external terminal forming step, and the dividing step, and the thinning step is performed on the wafer formed in a box-like body in the wafer forming step. Therefore, it is possible according to the manufacturing method to suppress the influence of substrate deformation on the wafer during formation of the wafer and to thereby improve the precision of processing in forming the wafer.

Alternatively, in the manufacturing method, closed-end holes filled with a conductor may be formed from the one main surface side of the lower lid members before the thinning step, in the thinning step, the wafer may be thinned from the other main surface until the closed-end holes are exposed, and in the external terminal forming step, the external terminals may be formed so as to cover the closed-end holes. In particular, the piezoelectric resonator plates may be made of crystal, the upper lid members and the lower lid members may be made of crystal or glass, the closed-end holes filled with the conductor may be formed from the one main surface side of the lower lid members before transitioning to the thinning step, the wafer may be thinned from the other main surface side of the wafer until the closed-end holes are exposed in the thinning step, and the external terminals may be formed so as to cover the closed-end holes in the external terminal forming step.

With the manufacturing method, since the material to be mainly thinned is a single material such as crystal or glass, it is easy to thin the wafer by means such as wet etching and to manage the thinning step.

Furthermore, in the manufacturing method, the wafer prepared in the wafer forming step may be formed to a thickness that is set in advance, and an amount of the thickness of the wafer to be thinned in the thinning step may be varied in accordance with a thickness of the piezoelectric resonator plates. Specifically, the thickness of the wafer prepared in the wafer forming step may be constant, and the amount of the thickness of the wafer to be thinned in the thinning step may vary in accordance with the thickness of the piezoelectric resonator plates. For example, in the case of using an AT-cut crystal plate as the piezoelectric resonator plates, it is easy according to this manufacturing method to size even piezoelectric resonator devices with different oscillation frequencies to the same overall height.

Specifically, in the case of using an AT-cut crystal plate as the piezoelectric resonator plates, the thickness of the piezoelectric resonator plates increases as the oscillation frequency of the AT-cut crystal plate decreases, because the oscillation frequency is inversely proportional to the thickness of the piezoelectric resonator plates. For the piezoelectric resonator devices with a configuration in which the piezoelectric resonator plates are sandwiched between the upper and lower lid members, since the thickness of the piezoelectric resonator plates varies depending on the oscillation frequency, the overall height of the piezoelectric resonator devices will vary if the upper lid members and the lower lid members have the same distance to the piezoelectric resonator plates. However, according to the above manufacturing method, the upper lid members are formed to a constant thickness, and the lower lid members (the wafer) are formed to a thickness greater than the required maximum thickness, so that the overall height of the piezoelectric resonator devices can be standardized to a constant height, irrespective of the oscillation frequency, by varying the amount of the thickness of the lower lid members to be thinned in accordance with the oscillation frequency. In other words, the thicknesses of the upper and lower lid members can be standardized in the initial state. This reduces the manufacturing cost.

Effects of the Invention

As described above, the present invention provides a method for manufacturing piezoelectric resonator devices that allows for a reduction in profile and offers excellent production efficiency.

DESCRIPTION OF REFERENCE NUMERALS

Figure 1:
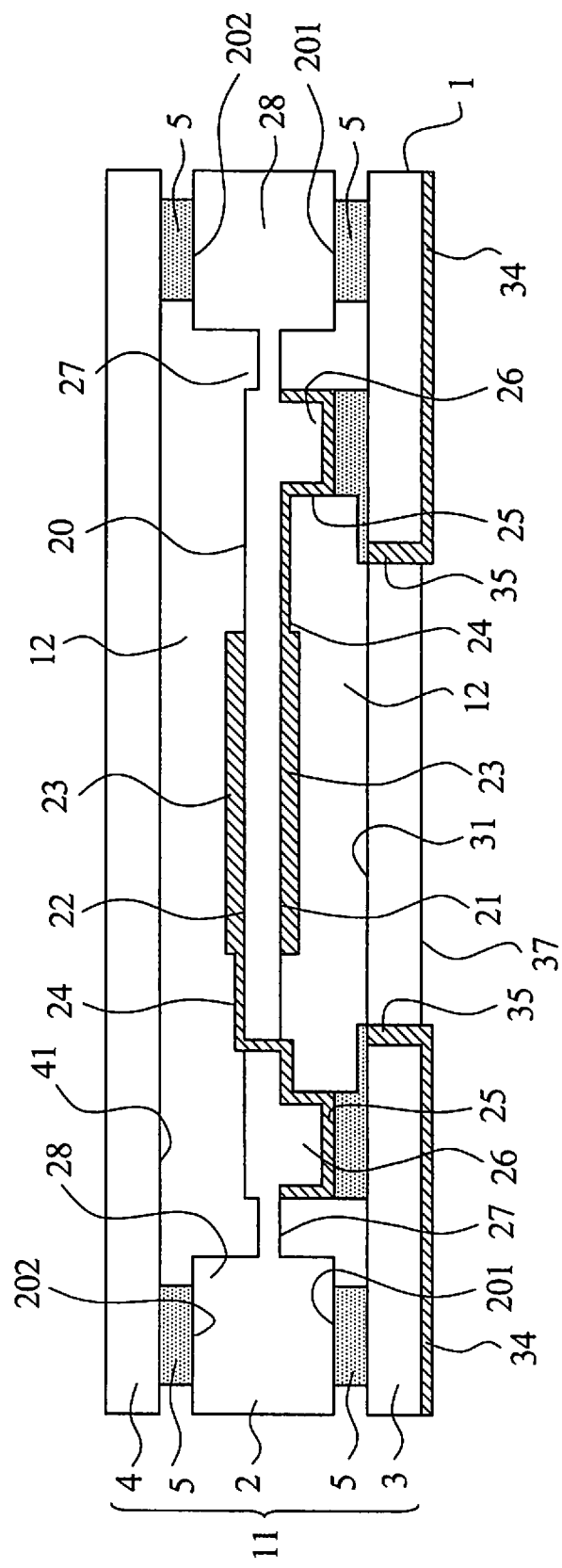
FIG. 1 is a cross-sectional schematic diagram of a crystal resonator illustrating Embodiment 1 of the present invention.

1 Crystal resonator
2 Crystal resonator plate
3 Vibration portion
201 One main surface of frame portion
202 Other main surface of frame portion
23 Excitation electrode
24 Extraction electrode
25 First junction electrode
26 Protruding portion
27 Thin-walled portion
28 Frame portion
3 Lower lid member
33 Second junction electrode
4 Upper lid member
5 Bonding material
50 Au-plated layer
51 First bonding material
52 Second bonding material
53 Third bonding material
54 Fourth bonding material

MODE FOR CARRYING OUT THE INVENTION

Embodiment 1

The following is a description of Embodiment 1 according to the present invention with reference to the drawings. The description of Embodiment 1 takes the example of a crystal resonator in which a crystal plate is used as a piezoelectric resonator plate.

FIG. 1 is a cross-sectional view of a crystal resonator 1 taken along the long side of a crystal resonator plate 2 according to Embodiment 1. As shown in FIG. 1, the crystal resonator 1 according to Embodiment 1 includes, as main constituent members, the crystal resonator plate 2 (a piezoelectric resonator plate according to the present invention), a lower lid member 3 that hermetically seals an excitation electrode 23 formed on one main surface 21 of the crystal resonator plate 2, and an upper lid member 4 that hermetically seals an excitation electrode 23 formed on the other main surface 22 of the crystal resonator plate 2.

In the crystal resonator 1, the crystal resonator plate 2 and the lower lid member 3 are bonded to each other with a bonding material 5, and the crystal resonator plate 2 and the upper lid member 4 are bonded to each other with a bonding material 5. This constitutes a package 11. By bonding the lower lid member 3 and the upper lid member 4 via the crystal resonator plate 2, two internal spaces 12 are formed in the package 11, and the excitation electrodes 23 formed on the two main surfaces 21 and 22 of the crystal resonator plate 2 are hermetically sealed in the respective internal spaces 12 of the package 11.

The lower lid member 3 and the upper lid member 4 have substantially the same shape and substantially the same outer dimensions. The lower lid member 3 has external terminals 34 formed on its bottom face (the other main surface) 37, and conduits (vias) 35 that are electrically connected to the external terminals 34 are formed in the thickness direction of the lower lid member 3, passing between the two main surfaces 31 and 37.

The following description first explains the main constituent members of the crystal resonator 1 with reference to FIG. 1 and then explains a method for manufacturing such crystal resonators 1.

The crystal resonator plate 2 shown in FIG. 1 is an AT-cut crystal plate that is cut out at a predetermined angle. The crystal resonator plate 2 includes a vibration portion 20 that is a thin-walled region where the excitation electrodes 23 are formed, protruding portions 26 formed in some regions on the outer periphery of the one main surface 21 of the vibration portion 20, a thin-walled portion 27, and a frame portion 28, all of the portions being integrally formed with one another. The frame portion 28 as used herein annularly encloses the vibration portion 20 and is formed thicker than the vibration portion 20. The protruding portions 26 and the frame portion 28 are formed such that the upper faces of the protruding portions 26 and one main surface 201 of the frame portion 28 are located in substantially the same plane. The thin-walled portion 27 is formed between the vibration portion 20 and the frame portion 28 and is thinner than the vibration portion 20.

The crystal resonator plate 2 (the vibration portion 20, the protruding portions 26, the thin-walled portion 27, and the frame portion 28) is formed by wet etching, and the excitation electrodes 23 are formed opposed to each other on the front and back faces (one main surface 21 and the other main surface 22) of the vibration portion 20 by vapor deposition. In Embodiment 1, the excitation electrodes 23 are configured by forming from the underside first a Cr film and then an Au film on the front and back main surfaces (one main surface 21 and the other main surface 22) of the vibration portion 20. Note that the film configuration of the excitation electrodes 23 is not intended to be limited thereto, and other film configurations may be employed.

As shown in FIG. 1, extraction electrodes 24 are formed by being led from the respective excitation electrodes 23 on the front and back of the crystal resonator plate 2. The extraction electrode 24 extracted from the excitation electrode 23 on the other main surface 22 passes through the vibration portion 20 in the direction of thickness from the other main surface 22 to the one main surface 21, and is led to the one main surface 21. The extraction electrode 24 is further led to the outer side (lateral surface) of the protruding portion 26 (the protruding portion on the left side of FIG. 1) so as to cover the surface of the protruding portion 26. A conductor portion of the extraction electrode 24 that is formed on the surface of the protruding portion 26 forms a first junction electrode 25. On the other hand, the extraction electrode 24 extracted from the excitation electrode 23 on the one main surface 21 is led to the outer side (lateral surface) of the protruding portion 26 (the protruding portion on the right side of FIG. 1) so as to cover the surface of the protruding portion 26. A conductor portion of the extraction electrode 24 that is formed on the surface of the protruding portion 26 forms a first junction electrode 25. An Au-plated layer 50 (see FIG. 7) is on top of the first junction electrodes 25. Note that in the figure illustrating Embodiment 1, although the excitation electrodes 23 are thicker than the extraction electrodes 24, the thicknesses of the excitation electrodes 23 and the extraction electrodes 24 are not intended to be limited thereto, and the excitation electrodes 23 and the extraction electrodes 24 may have the same thickness.

As shown in FIG. 1, the two main surfaces 21 and 22 of the crystal resonator plate 2 are mirror finished and formed to flat smooth surfaces. In the crystal resonator plate 2, the two main surfaces 201 and 202 of the frame portion 28 are configured as bonding faces between the lower lid member 3 and the upper lid member 4, and the vibration portion 20 is configured as a vibration region. A first bonding material 51 (see FIG. 7) serving as a bonding layer for bonding the lower lid member 3 is formed on the one main surface 201 of the frame portion 28. Also, a second bonding material 52 (see FIG. 7) serving as a bonding layer for bonding the upper lid member 4 is formed on the other main surface 202 of the frame portion 28. The first bonding material 51 and the second bonding material 52 are formed to substantially the same width and have the same film configuration, and the first bonding material 51 and the second bonding material 52 are configured by laminating multiple metal films on the two main surfaces 201 and 202 of the frame portion 28. In Embodiment 1, the first bonding material 51 and the second bonding material 52 are configured by forming from the lowermost layer side first a Cr layer (not shown) and then an Au layer (not shown) by vapor deposition and laminating an Au-plated layer (not shown) thereon by electroplating.

The lower lid member 3 is a flat plate that is rectangular in plan view, and is made of a Z plate crystal. The lower lid member 3 has substantially the same outer dimensions as the crystal resonator plate 2 in plan view. The lower lid member 3 has a region that is bonded to the crystal resonator plate 2 on the outer periphery of the one main surface 31 and in a region in the vicinity of and along the outer periphery. The one main surface 31 of the lower lid member 3 is a flat smooth surface (mirror-finished surface). Furthermore, second junction electrodes 33 (see FIG. 7) are formed on the one main surface 31 of the lower lid member 3. The second junction electrodes 33 are formed on the inner side than the region bonded to the crystal resonator plate 2 on the one main surface 31 of the lower lid member 3, and are bonded to the first junction electrodes 25 via the Au-plated layer 50. The second junction electrodes 33 are formed by laminating multiple metal films on the bonding region, specifically, by forming from the lowermost layer side first a Cr layer (not shown) and then an Au layer 331 by vapor deposition, laminating an Au—Sn alloy layer 332 thereon, and further laminating an Au flash plated layer (not shown) thereon (see FIG. 7). Alternatively, the second junction electrodes 33 may be configured by forming from the underside first a Cr layer and then an Au layer by vapor deposition and laminating thereon first a Sn-plated layer and then an Au-plated layer. Furthermore, the lowermost layer of the second junction electrodes 33 may be other layers such as an Mo layer, a W layer, or a Ti layer, instead of the Cr layer. Although a Z plate crystal is used for the lower lid member 3, the lower lid member 3 may be made of other types of crystal, or may be made of glass.

A third bonding material 53 (see FIG. 7) serving as a bonding layer is formed in the region of the lower lid member 3 that is bonded to the crystal resonator plate 2. Specifically, the third bonding material 53 is formed by laminating multiple metal films on the bonding region, more specifically, by forming from the lowermost layer side first a Cr layer (not shown) and then an Au layer 531 (see FIG. 7) by vapor deposition, laminating thereon an Au—Sn alloy layer 532 (see FIG. 7), and further laminating thereon an Au flash plated layer (not shown). Alternatively, the third bonding material 53 may be configured by forming from the underside first a Cr layer and then an Au layer by vapor deposition and laminating thereon first an Sn-plated layer and then an Au-plated layer. Note that the third bonding material 53 and the second junction electrode 33 are formed simultaneously and have the same configuration. Furthermore, the third bonding material 53 is formed to substantially the same width as the first bonding material 51. Furthermore, the vias 35 for continuity of the excitation electrodes 23 of the crystal resonator plate 2 to outside are formed in the lower lid member 3. Electrode patterns 36 are formed via these vias 35 from the second junction electrodes 33 on the one main surface 31 of the lower lid member 3 to the external terminals 34 on the other main surface 37 of the lower lid member 3.

As shown in FIG. 1, the upper lid member 4 is a flat plate that is rectangular in plan view, and is made of a Z plate crystal like the lower lid member 3. The upper lid member 4 has substantially the same outer dimensions as the crystal resonator plate 2 in plan view. The upper lid member 4 has a region that is bonded to the crystal resonator plate 2 on the outer periphery of one main surface 41 and in a region in the vicinity of the outer periphery. The one main surface 41 of the upper lid member 4 is a flat smooth surface (mirror-finished surface).

A fourth bonding material 54 (see FIG. 8) serving as a bonding layer for bonding the crystal resonator plate 2 is formed in the region of the upper lid member 4 that is bonded to the crystal resonator plate 2. Specifically, the fourth bonding material 54 is configured by laminating multiple metal films on the bonding region, more specifically, by forming from the lowermost layer side first a Cr layer (not shown) and then an Au layer 541 (see FIG. 8) by vapor deposition, laminating thereon an Au—Sn alloy layer 542 (see FIG. 8), and further laminating thereon an Au flash plated layer (not shown). Alternatively, the fourth bonding material 54 may be configured by forming from the underside first a Cr layer and then an Au layer by vapor deposition and laminating thereon first an Sn-plated layer and then an Au-plated layer. The fourth bonding material 54 is formed to substantially the same width as the second bonding material 52.

In the crystal resonator 1 with the above configuration, a bonding region (seal path) of the first bonding material 51 on the bonding surface of the crystal resonator plate 2 (the one main surface 201 of the frame portion 28) and a bonding region (seal path) of the third bonding material 53 on the bonding surface of the lower lid member 3 have the same width. Furthermore, a bonding region (seal path) of the second bonding material 52 on the bonding surface of the crystal resonator plate 2 (the other main surface 202 of the frame portion 28) and a bonding region (seal path) of the fourth bonding material 54 on the bonding surface of the upper lid member 4 have the same width.

The above has been a description of the main constituent members of the crystal resonator 1.

Next is a description of a method for manufacturing such crystal resonators 1 according to Embodiment 1 with reference to FIGS. 2 to 13.

Figure 2:
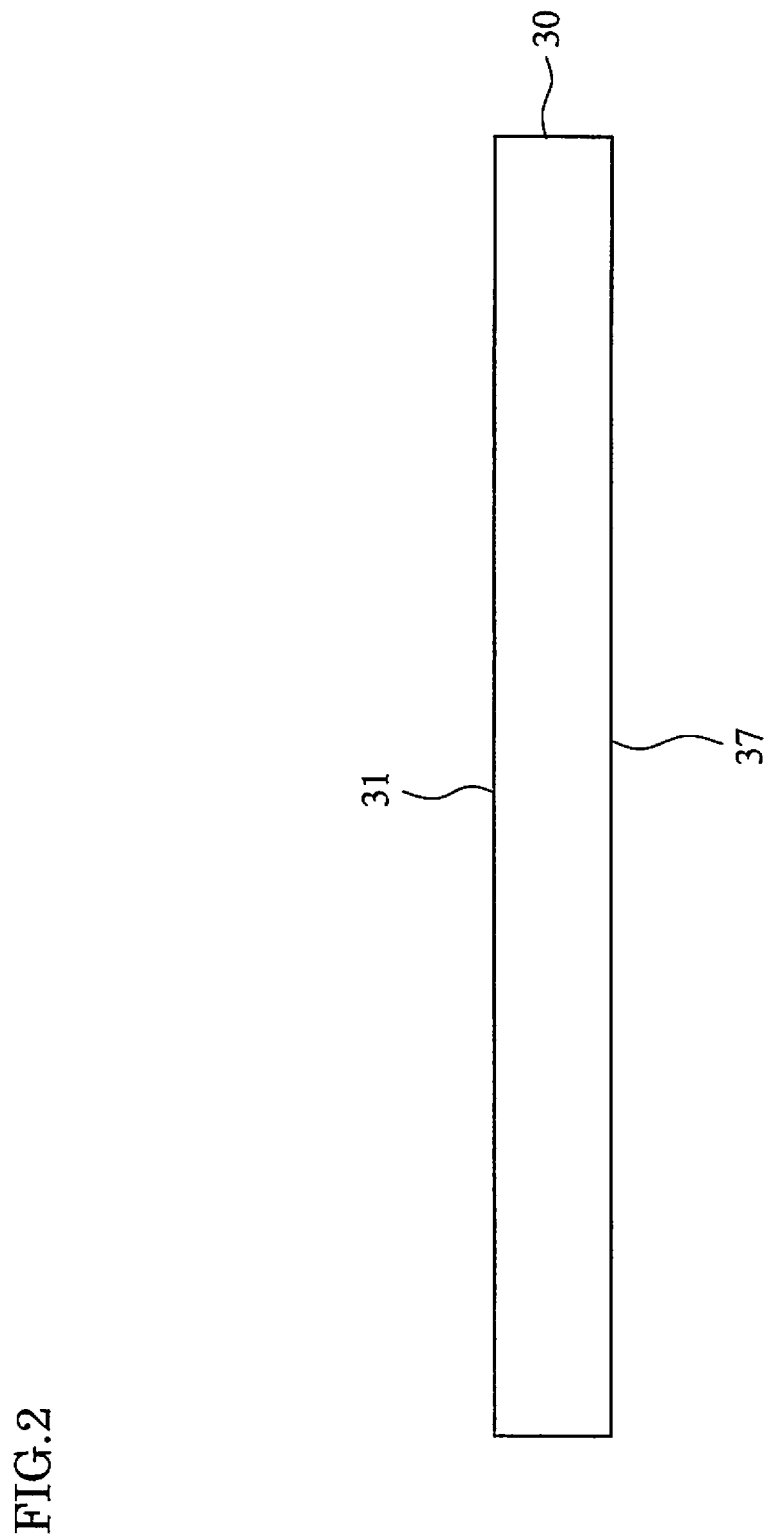
FIG. 2 is a schematic diagram showing a method for manufacturing crystal resonators according to Embodiment 1 of the present invention.

First, a thick-walled wafer 30 integrally formed with a large number of lower lid members 3 is prepared as shown in FIG. 2 (wafer forming step). Note that for the sake of convenience of description, the upper main surface is referred to as the "one main surface 31", and the lower main surface is referred to as the "other main surface 37" in FIG. 2. The wafer 30 is made of a Z plate crystal, and its one main surface 31 is a flat smooth surface (mirror-finished surface).

Figure 3:
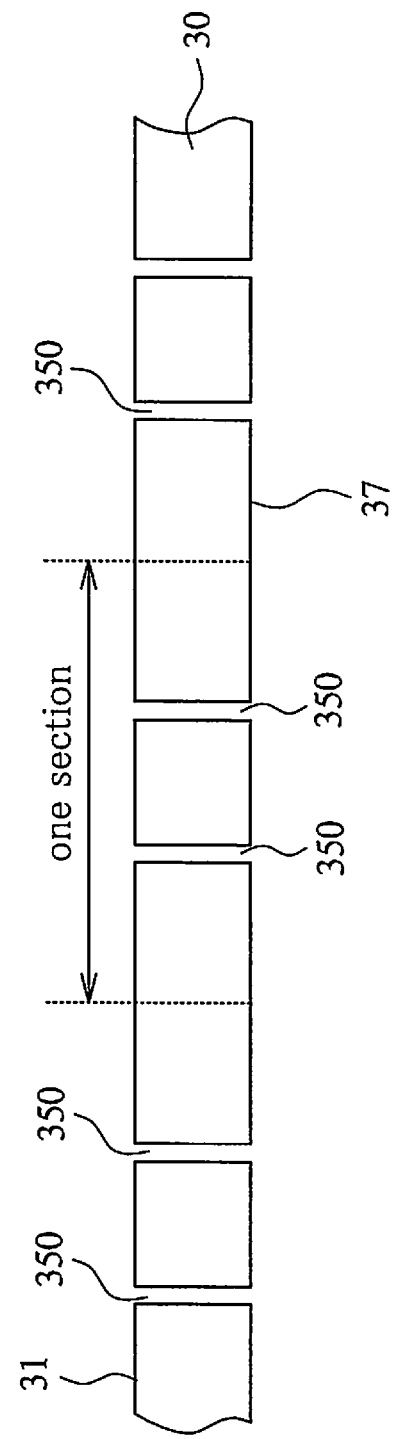
FIG. 3 is a schematic diagram showing the method for manufacturing crystal resonators according to Embodiment 1 of the present invention.

Next, as shown in FIG. 3, multiple through holes 350 are formed by wet etching at predetermined positions in a region of the wafer 30 where each lower lid member 3 is formed (a region referred to as "one section" in FIG. 3).

Figure 4:
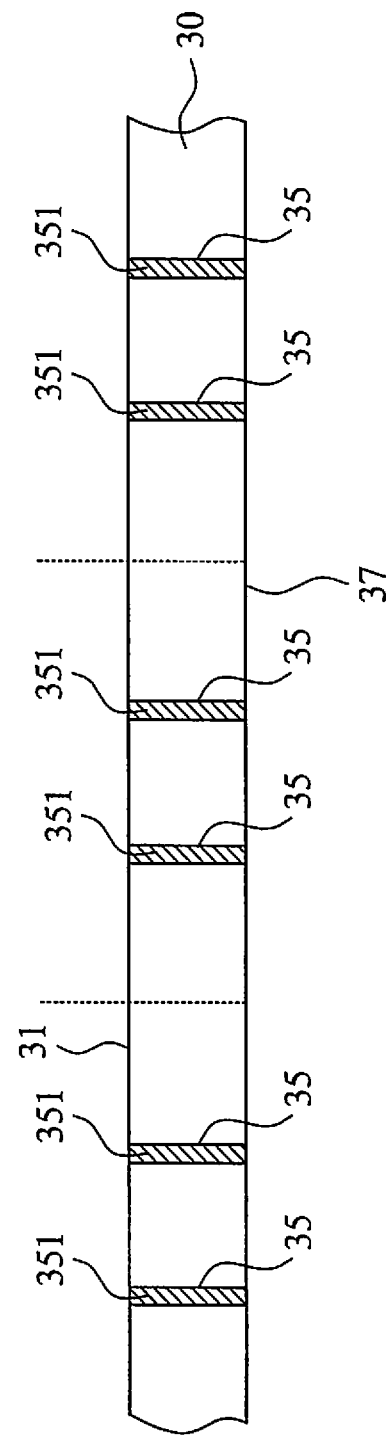
FIG. 4 is a schematic diagram showing the method for manufacturing crystal resonators according to Embodiment 1 of the present invention.

Then, feedthrough conductors 351 are filled in the through holes 350 so as to form the vias 35 as shown in FIG. 4. In Embodiment 1, an Au layer serving as a seed layer is adhered to the inner wall surfaces of the through holes 350 by vapor deposition, and then an Au-plated layer and an Sn-plated layer are formed thereon by electroplating. Thereafter, these metal layers are heated and melted into an integral body so that the feedthrough conductors 351 made of an Au—Sn alloy are formed (filled) in the through holes 350. Note that the method for forming the feedthrough conductors 351 in the through holes 350 is not limited to the above method, and, for example, the seed layer may be a metal film other than Au. Alternatively, an Au—Sn alloy may be used from the very start. Still alternatively, the feedthrough conductors 351 may be made of, instead of an Au—Sn alloy, an Au—Ge alloy or a metal material that contains Cu (specifically, for example, a metal material configured by forming a Ti—Cu sputtering film as a seed layer and forming thereon a Cu plated film).

Figure 5:
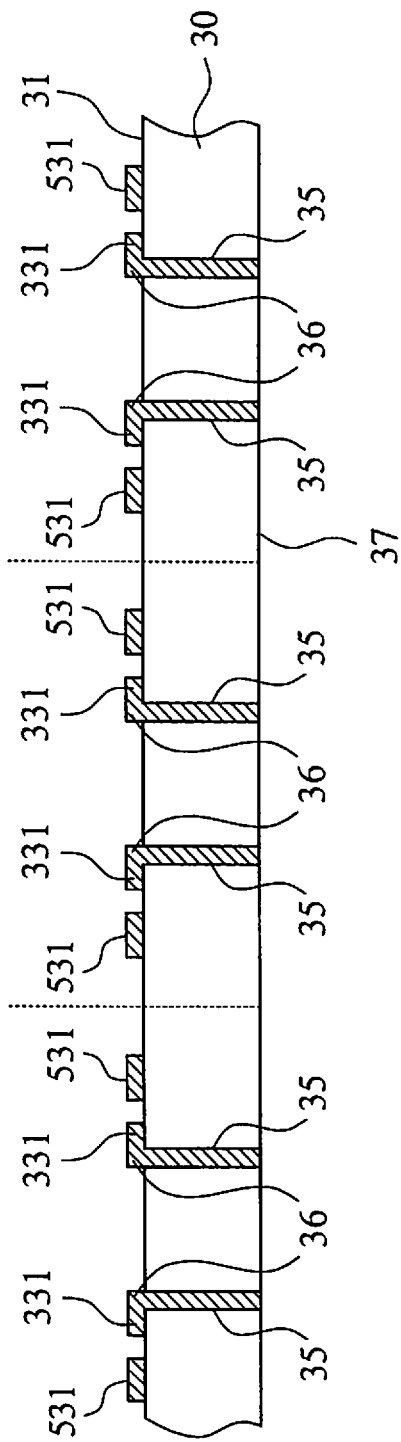
FIG. 5 is a schematic diagram showing the method for manufacturing crystal resonators according to Embodiment 1 of the present invention.

Next, as shown in FIG. 5, first a Cr layer (not shown) is formed and then the Au layers 331 and 531 are formed on top of the Cr layer on the one main surface 31 side of the wafer 30, specifically, in the regions of each lower lid member 3 that are bonded to the crystal resonator plate 2 and in positions of each lower lid member 3 corresponding to the first junction electrodes 25 of the crystal resonator plate 2. Specifically, the Cr layer and the Au layers 331 and 531 are formed by vapor deposition. Note that in FIG. 5, the Au layer formed in the regions of each lower lid member 3 that are bonded to the crystal resonator plate 2 is designated by reference numeral 531, and the Au layer formed at the positions of each lower lid member 3 corresponding to the first junction electrodes 25 of the crystal resonator plate 2 is designated by reference numeral 331 (electrode pattern). The electrode patterns 36 are formed to be connected to the upper ends of the vias 35.

Figure 6:
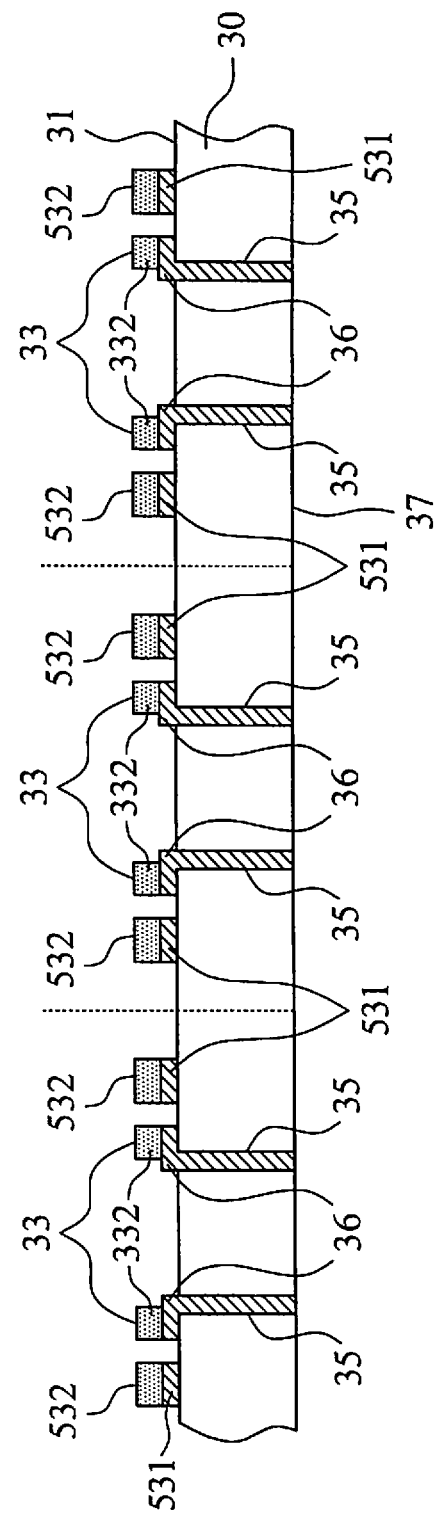
FIG. 6 is a schematic diagram showing the method for manufacturing crystal resonators according to Embodiment 1 of the present invention.

Next, a metal layer made of an Au—Sn alloy is formed by electroplating on the Au layer 531 and the Au layer 331 of the electrode patterns 36 formed on the one main surface 31 of the wafer 30 (see FIG. 6). Specifically, the Au—Sn alloy layer 532 is formed on the Au layer 531, and the Au—Sn alloy layer 332 is formed on the Au layer 331 of the electrode patterns 36. Then, an ultrathin Au flash plated layer (not shown) is laminated as an upper layer of the Au—Sn alloy layers 332 and 532 so as to form the third bonding material 53 from the Au layer 531, the Au—Sn alloy layer 532, and the Au flash plated layer and form the second junction electrodes 33 from the Au layer 331, the Au—Sn alloy layer 332, and the Au flash plated layer (see FIG. 7). Note that although the metal layer is made of an Au—Sn alloy, it may have a configuration other than the Au—Sn alloy and may be configured by, for example, laminating first an Sn-plated layer and then an Au plated layer.

Figure 7:
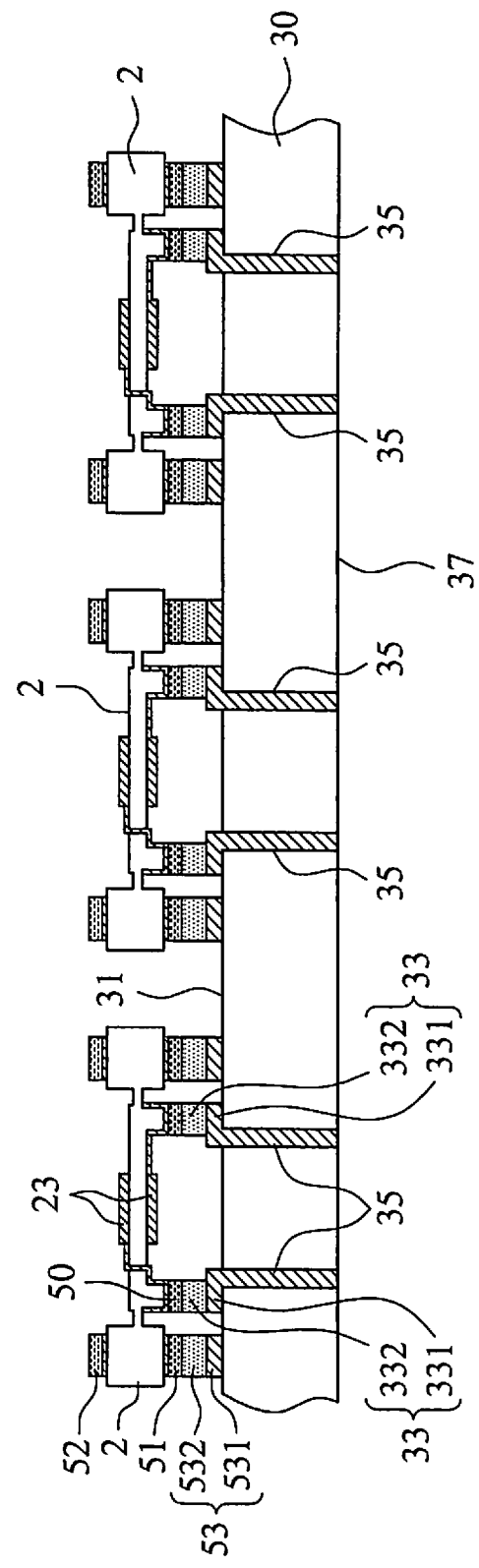
FIG. 7 is a schematic diagram showing the method for manufacturing crystal resonators according to Embodiment 1 of the present invention.

A large number of individual crystal resonator plates 2 are placed by image recognition means on the third bonding material 53 and the second junction electrodes 33 shown in FIG. 6, with the one main surfaces 21 of the crystal resonator plates 2 facing the one main surfaces 31 of the lower lid members 3 (see FIG. 7). In this case, the third bonding materials 53 of the lower lid members 3 and the first bonding materials 51 formed on the one main surfaces 201 of the frame portions 28 of the crystal resonator plates 2 are placed in substantially the same positions in plan view. Furthermore, the second junction electrodes 33 formed on the one main surfaces 31 of the lower lid members 3 and the Au-plated layers 50 formed on the first junction electrodes 25 of the crystal resonator plates 2 are placed in substantially the same positions in plan view.

Figure 8:
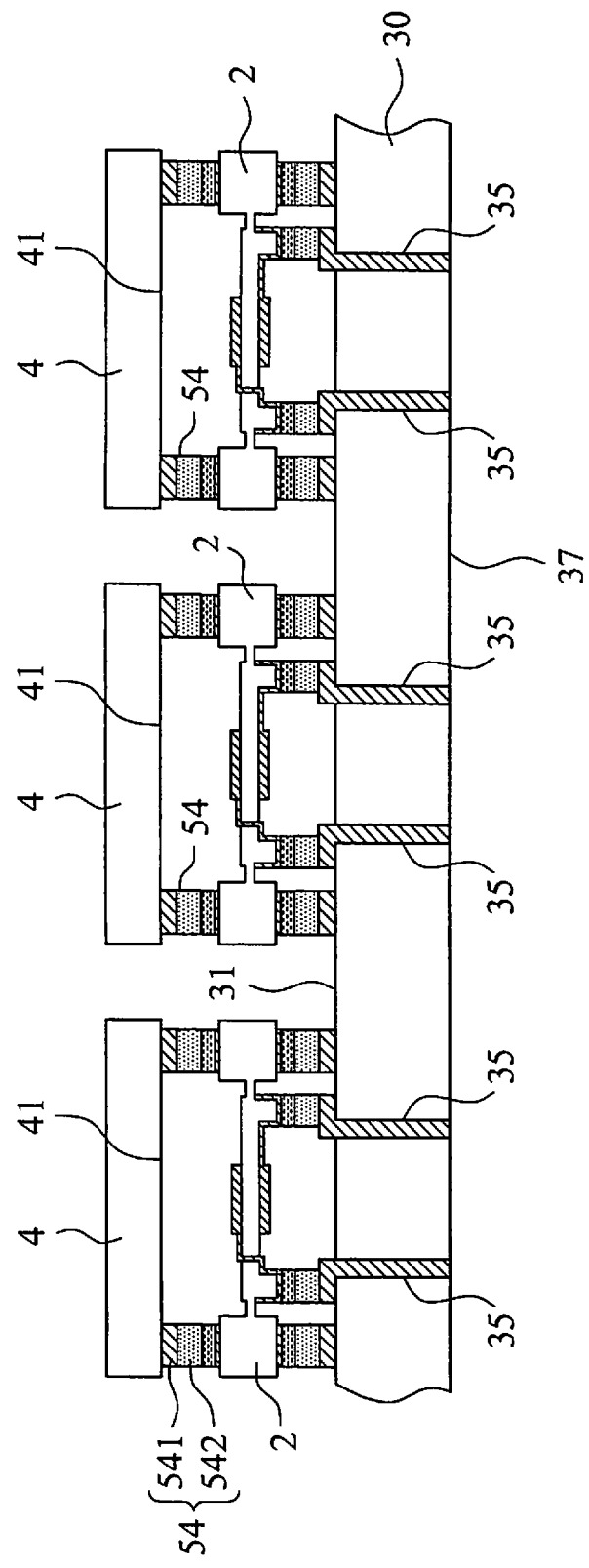
FIG. 8 is a schematic diagram showing the method for manufacturing crystal resonators according to Embodiment 1 of the present invention.

After the crystal resonator plates 2 have been placed on the lower lid members 3, individual upper lid members 4 are placed in positions determined by image recognition means on the other main surfaces 202 of the frame portions 28 of the crystal resonator plates 2, with the one main surfaces 41 of the upper lid members facing the other main surfaces 22 of the crystal resonator plates 2 (see FIG. 8). In this case, the second bonding materials 52 formed on the other main surfaces 202 of the frame portions 28 of the corresponding crystal resonator plates 2 and the fourth bonding materials 54 formed on the bonding surfaces (one main surfaces 41) of the upper lid members 4 are placed in substantially the same positions in plan view.

After the crystal resonator plates 2 and the upper lid members 4 have been laminated on the lower lid members 3, the lower lid members 3, the crystal resonator plates 2, and the upper lid members 4 are temporarily bonded to one another, using ultrasonic waves.

Figure 9:
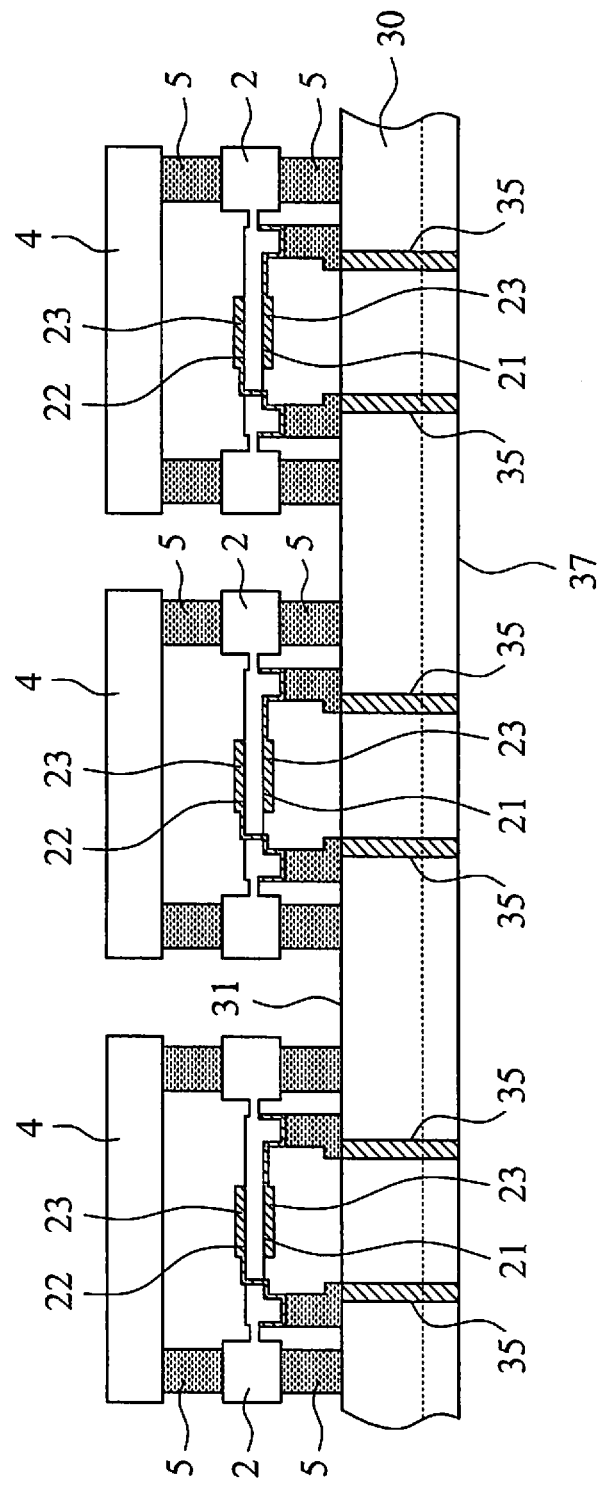
FIG. 9 is a schematic diagram showing the method for manufacturing crystal resonators according to Embodiment 1 of the present invention.

Next, the lower lid members 3, the crystal resonator plates 2, and the upper lid members 4, which have been temporarily bonded to one another, are placed in an environment where temperature is increased to a predetermined temperature, and as shown in FIG. 9, the bonding materials formed on the respective members (the first bonding materials 51, the second bonding materials 52, the third bonding materials 53, and the fourth bonding materials 54) are melted for permanent bonding (bonding step). Specifically, the first bonding materials 51 and the third bonding materials 53 are bonded to each other to form bonding materials 5, and the crystal resonator plates 2 and the lower lid member 3 are bonded with the bonding materials 5. By bonding the crystal resonator plates 2 and the lower lid member 3 with the bonding materials 5, the excitation electrodes 23 formed on the one main surfaces 21 of the crystal resonator plates 2 are hermetically sealed. At the same time that the crystal resonator plates 2 and the lower lid members 3 are bonded to each other, the second junction electrodes 33 and the first junction electrodes 25 of the crystal resonator plates 2 are electromechanically bonded to each other via the Au-plated layers 50. Furthermore, at the same time that the first bonding materials 51 and the third bonding materials 53 are bonded to each other, the second bonding materials 52 and the fourth bonding materials 54 are heated, melted and thereby bonded to each other so as to form bonding materials 5, and the crystal resonator plates 2 and the upper lid members 4 are bonded to each other with the bonding materials 5. By bonding the crystal resonator plates 2 and the upper lid members 4 with the bonding materials 5, the excitation electrodes 23 formed on the other main surfaces 22 of the crystal resonator plates 2 are hermetically sealed. At the same time as the generation of the bonding materials 5, the Au-plated layers 50 of the crystal resonator plates 2 and the second junction electrodes 33 of the lower lid members 3 are bonded to each other, so as to create an alloy as shown in FIG. 9. In FIG. 9, although all of the second junction electrodes 33 of the lower lid members 3 are alloyed, the present invention is not intended to be limited thereto, and some of the second junction electrodes 33 may be alloyed. Note that in Embodiment 1, the lower lid members 3, the crystal resonator plates 2, and the upper lid members 4 are temporarily and permanently bonded to one another in a vacuum atmosphere. However, the present invention is not intended to be limited thereto, and the lower lid members 3, the crystal resonator plates 2, and the upper lid members 4 may be temporarily and permanently bonded to one another in an inert gas atmosphere such as a nitrogen atmosphere.

With the above permanent bonding, a large number of upper lid members 4 and a large number of crystal resonator plates 2 are bonded to the one main surface 31 of the wafer 30. In this condition, wax is applied (not shown) so as to fill in the gaps between adjacent pairs of the upper lid members 4 and the crystal resonator plates 2. Thereafter, a wafer-like glass plate (not shown) serving as a protective member is attached to the upper faces of the large number of upper lid members 4. In this case, the glass plate has substantially the same size as the wafer 30.

Figure 10:
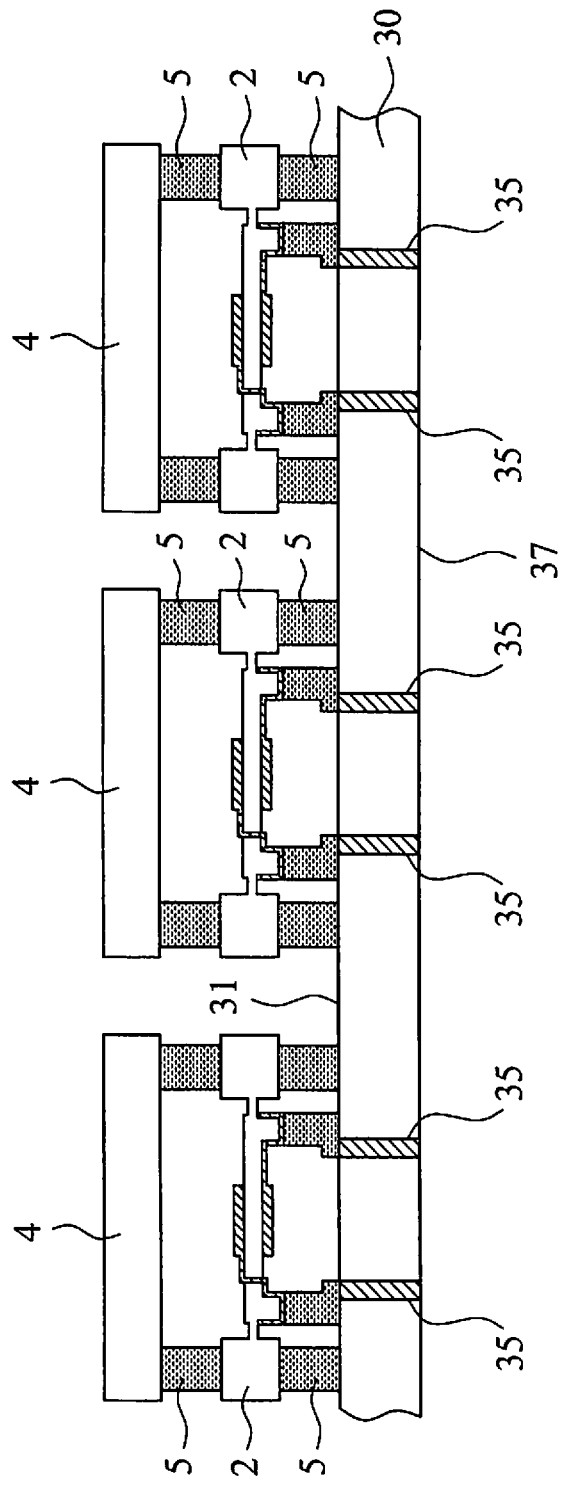
FIG. 10 is a schematic diagram showing the method for manufacturing crystal resonators according to Embodiment 1 of the present invention.

Then, the wafer 30 protected by the wafer-like glass plate and the wax is thinned from the other main surface 37 side as shown in FIG. 10 (thinning step). In this case, the amount of the thickness to be thinned is indicated by the dotted line shown in FIG. 9. In Embodiment 1, the wafer 30 is thinned by mechanical polishing. The present invention is, however, not intended to be limited thereto, and, for example, the wafer 30 may be thinned by chemical mechanical polishing.

Figure 11:
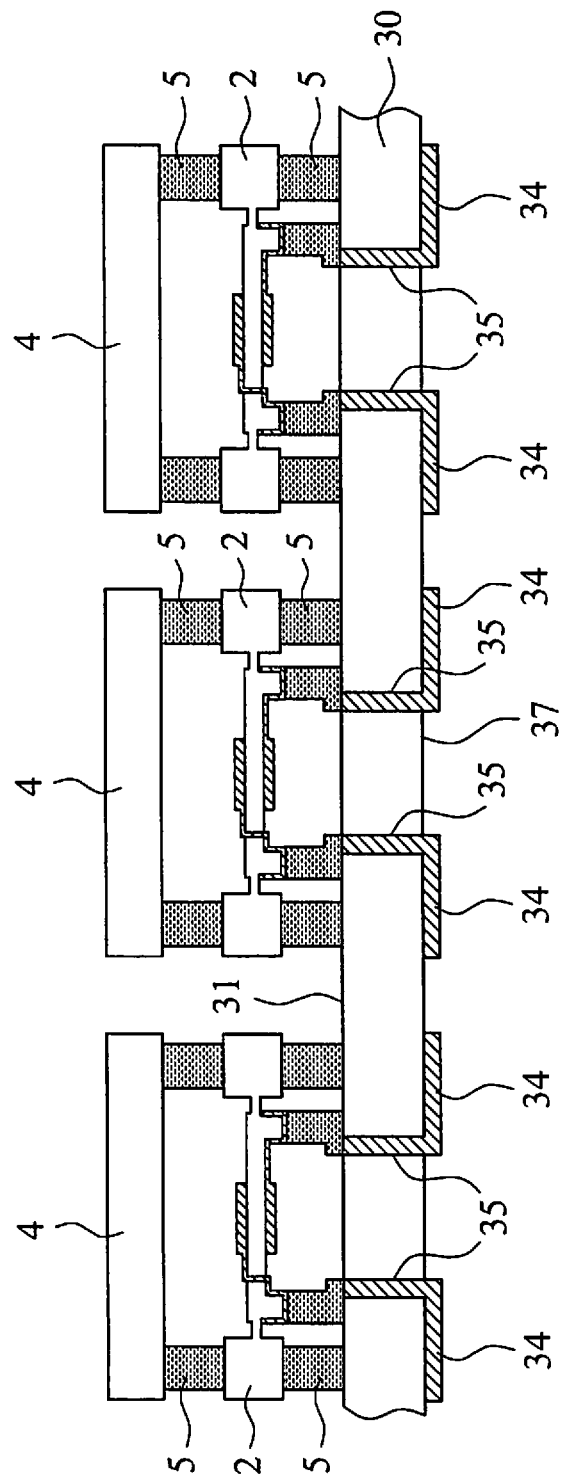
FIG. 11 is a schematic diagram showing the method for manufacturing crystal resonators according to Embodiment 1 of the present invention.

Then, the external terminals 34 are formed by vapor deposition on the other main surface 37 side of the thinned wafer 30 as shown in FIG. 11 (external terminal forming step). The external terminals 34 have a film configuration formed by laminating first a Cr layer and then an Au layer on crystal. As shown in FIG. 11, the external terminals 34 are formed so as to be connected to the lower ends of the vias 35 (the other main surface 37 of the wafer 30).

Figure 12:
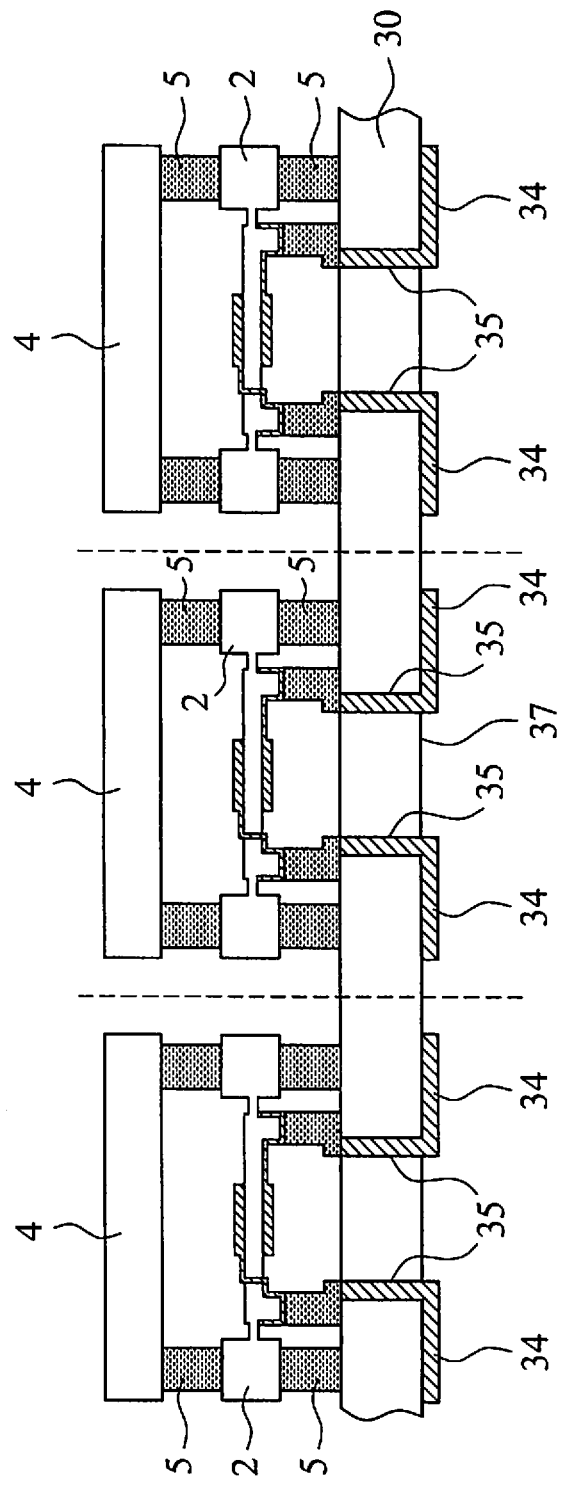
FIG. 12 is a schematic diagram showing the method for manufacturing crystal resonators according to Embodiment 1 of the present invention.
Figure 13:
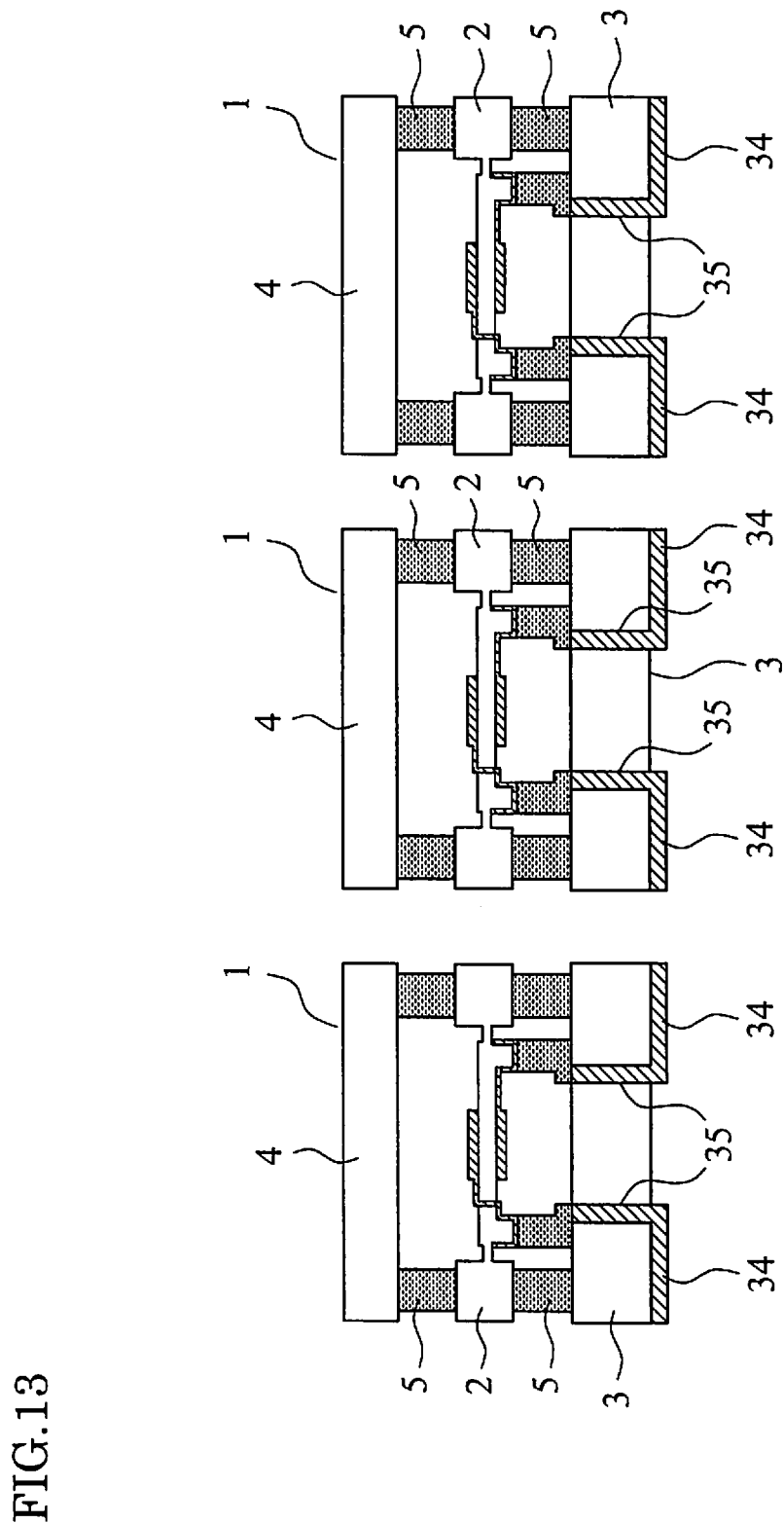
FIG. 13 is a schematic diagram showing the method for manufacturing crystal resonators according to Embodiment 1 of the present invention.

After the external terminal forming step, the aforementioned glass plate and wax are removed. Thereafter, the wafer 30 is cut in positions that are substantially the centers between adjacent crystal resonators 1 (lines indicated by the dotted lines in FIG. 12), as shown in FIG. 12. Specifically, the wafer 30 is cut vertically and horizontally by dicing, using the lines indicated by the dotted lines in FIG. 12 as a reference, so that a large number of crystal resonators 1 are simultaneously and collectively obtained as shown in FIG. 13 (dividing step).

With the above-described manufacturing method, it is possible to efficiently manufacture the crystal resonators 1, each including the lower lid member 3 having the external terminals 34 formed thereon for connection to external devices. Specifically, since the wafer 30 integrally formed with a large number of lower lid members 3 is thick walled and thinned from the bottom face side (the other main surface 37 side) after the bonding step, it is possible to simultaneously and collectively adjust the thicknesses of the lower lid members 3. Then, after the external terminals 34 are collectively formed on the thinned lower lid members 3, the wafer is cut in positions between adjacent crystal resonators 1. This enables efficient manufacture of a large number of crystal resonators 1.

Note that in the configuration of Embodiment 1, the crystal resonator plates 2 have an inverted mesa shape in which the protruding portions 26 are formed on the outer periphery of the vibration portion 20, and the thin-walled portion 27 is formed on the outer side of the vibration portion 20 and the protruding portions 26. The present invention is, however, not limited to this configuration, and, for example, a configuration is also possible in which a portion on the inner side of the frame portion 28 is formed to a flat plate and through holes are formed in parts without forming the thin-walled portion 27.

Although Cr, Au, and Sn are used for the bonding materials 5 in Embodiment 1, the present invention is not intended to be limited thereto, and the bonding materials 5 may be configured of, for example, Cr, Au, and Ge. Furthermore, a configuration is also possible in which a plated laminated film such as an Au or Sn film, or a plated alloy layer such as an Au—Sn alloy layer may be formed on the crystal resonator plates 2, whereas an Au-plated layer (a plated layer of a single metal element) may be formed on the lower lid members 3 or the upper lid members 4. Furthermore, although crystal is used as a material for the two package base members in Embodiment 1, a material other than crystal may be used, such as borosilicate glass or other types of glass, or sapphire.

Embodiment 2

The following is a description of Embodiment 2 according to the present invention. The description of Embodiment 2 takes the example of a crystal resonator in which a crystal resonator plate is used as a piezoelectric resonator plate like Embodiment 1. Accordingly, the same reference numerals are given to constituent members of Embodiment 2 that are similar to those of Embodiment 1, and descriptions thereof will be partly omitted herein. Furthermore, similar effects can also be achieved by constituent parts of the configuration of Embodiment 2 that are similar to those of the configuration of Embodiment 1. Accordingly, the following description of Embodiment 2 focuses on differences from Embodiment 1.

First, a thick-walled wafer 30 integrally formed with a large number of lower lid members 3 is prepared (wafer forming step). The wafer 30 is made of a Z plate crystal, and its one main surface 31 is a flat smooth surface (mirror-finished surface) (see FIG. 2).

Figure 14:
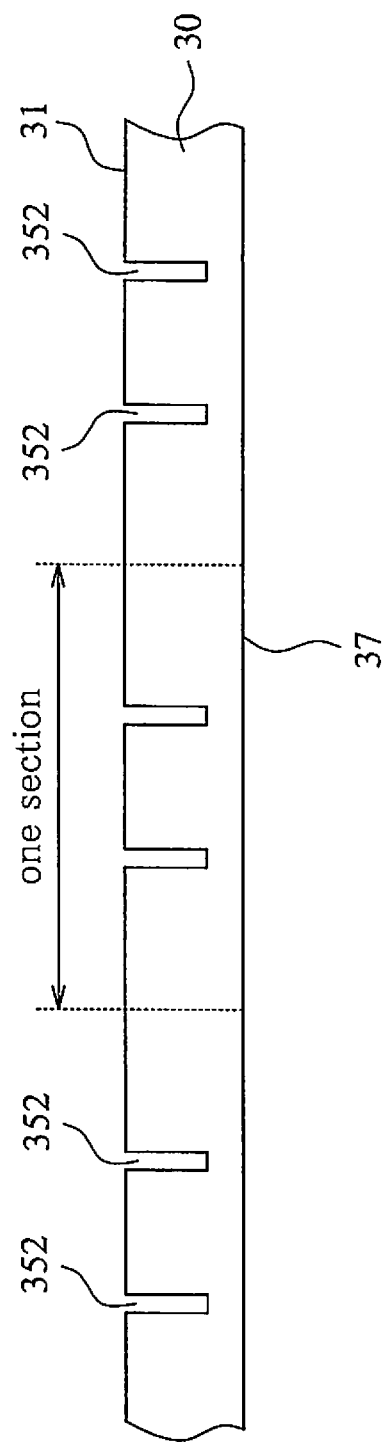
FIG. 14 is a schematic diagram showing a method for manufacturing crystal resonators according to Embodiment 2 of the present invention.

Then, as shown in FIG. 14, the wafer shown in FIG. 2 is subjected to wet etching so as to form multiple closed-end holes 352 in predetermined positions in a region of the wafer 30 where each lower lid member 3 is formed (a region referred to as "one section" in FIG. 14). The closed-end holes 352 are formed by wet etching.

Figure 15:
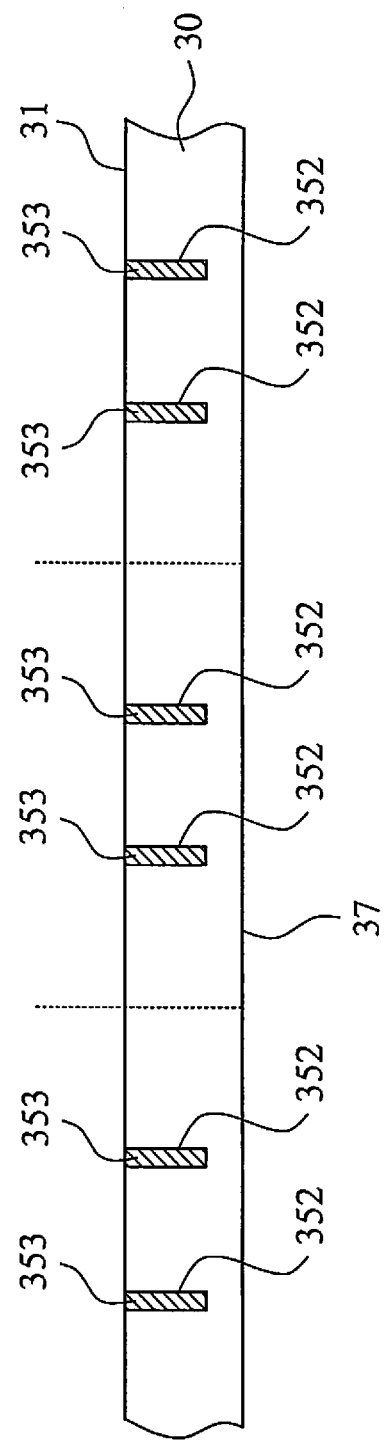
FIG. 15 is a schematic diagram showing the method for manufacturing crystal resonators according to Embodiment 2 of the present invention.

After the closed-end holes 352 have been formed, conductors 353 are formed in the closed-end holes 352 as shown in FIG. 15. The conductors 353 as used herein are made of the same material as the feedthrough conductors 351 described in Embodiment 1.

Figure 16:
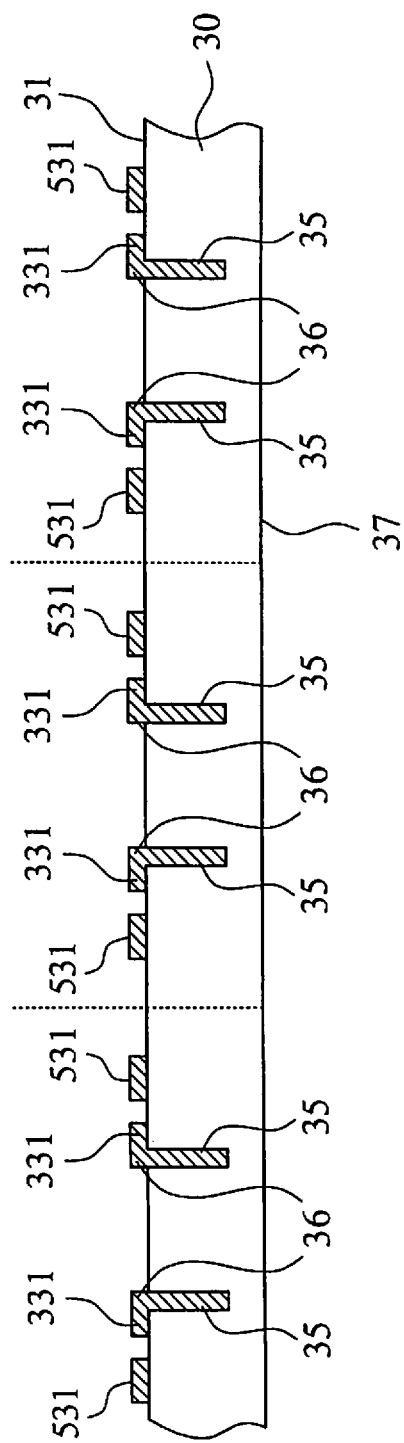
FIG. 16 is a schematic diagram showing the method for manufacturing crystal resonators according to Embodiment 2 of the present invention.

Next, as shown in FIG. 16, metal films (not shown) are formed from the underside, first a Cr layer and then an Au layer, on the one main surface 31 side of the wafer 30, specifically, in a region of each lower lid member 3 that is bonded to the crystal resonator plate 2 and in positions of each lower lid member 3 corresponding to the first junction electrodes 25 of the crystal resonator plate 2. Specifically, a Cr layer (not shown) and Au layers 331 and 531 are formed by vapor deposition.

Then, with the same procedure as in Embodiment 1, Au—Sn alloy layers (see reference numerals 332 and 532 in FIG. 6) are collectively formed by electroplating on top of the Au layer 531 and the electrode patterns 36 (Au layer 331), and further an ultrathin Au flash plated layer (not shown) is laminated on top of the Au—Sn alloy layers 332 and 532. In the lower lid members 3, the third bonding material 53 is formed from the Au layer 531, the Au—Sn alloy layer 532, and the Au flash plated layer, and the second junction electrodes 33 are formed from the Au layer 331, the Au—Sn alloy layer 332, and the Au flash plated layer.

Figure 17:
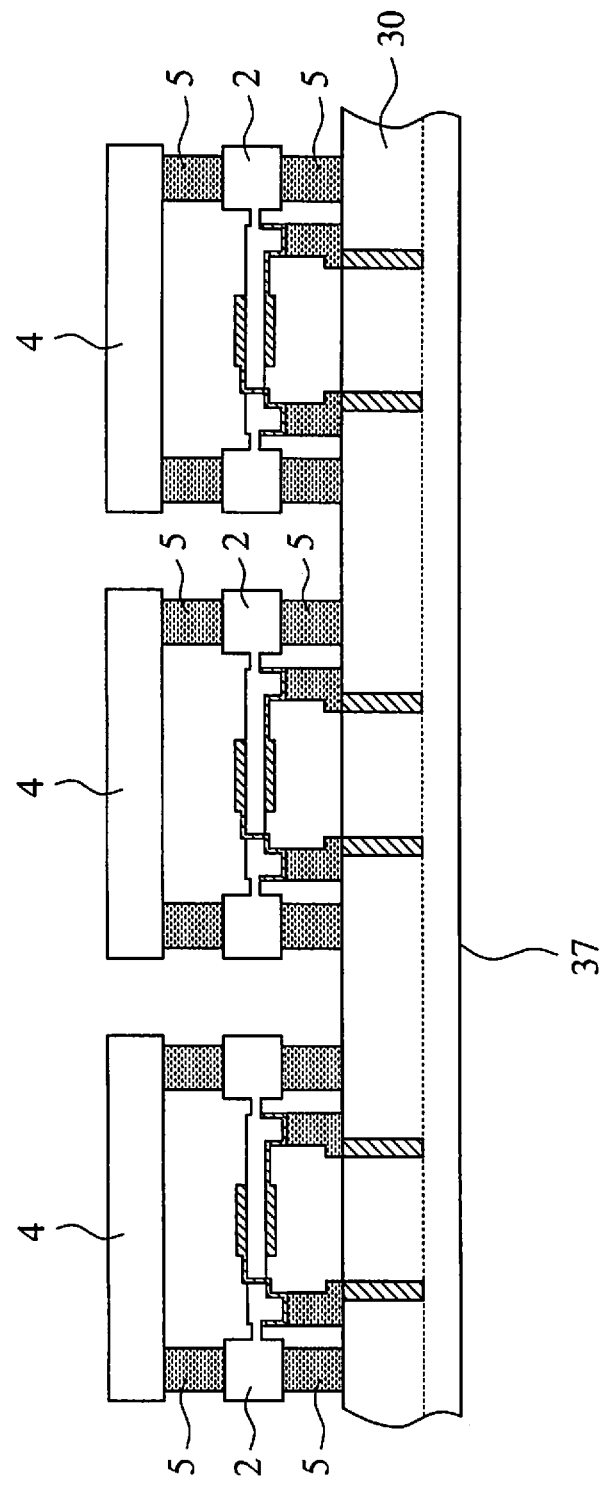
FIG. 17 is a schematic diagram showing the method for manufacturing crystal resonators according to Embodiment 2 of the present invention.

Then, with the same procedure as in Embodiment 1, a large number of individual crystal resonator plates 2 are placed in alignment by image recognition means in the regions of the one main surface 31 of the wafer 30, which was formed in accordance with the above manufacturing method, where the large number of lower lid members 3 are formed. Then, the large number of crystal resonator plates 2 placed in alignment are temporarily bonded to the wafer 30. A large number of individual upper lid members 4 are placed in alignment by image recognition means on the other main surfaces 202 of the frame portions 28 of the temporarily bonded crystal resonator plates 2, and the crystal resonator plates 2 and the upper lid members 4 are temporarily bonded to each other. The wafer 30, the crystal resonator plates 2, and the upper lid members 4, which have been temporarily bonded to one another, are then placed in an environment where temperature is increased to a predetermined temperature, and as shown in FIG. 17, the first bonding materials 51, the second bonding materials 52, the third bonding materials 53, and the fourth bonding materials 54 formed on the wafer 30, the crystal resonator plates 2, and the upper lid members 4 are melted for permanent bonding (bonding step). In the bonding step, as shown in FIG. 17, the first bonding materials 51 and the third bonding materials 53 are bonded to each other so as to form bonding materials 5, and the crystal resonator plates 2 and the lower lid members 3 are bonded to each other with the bonding materials 5. At the same time that the crystal resonator plates 2 and the lower lid members 3 are bonded to each other, the second junction electrodes 33 and the first junction electrodes 25 of the crystal resonator plates 2 are electromechanically bonded to each other via the Au-plated layers 50. Furthermore, the second bonding materials 52 and the fourth bonding materials 54 are heated, melted, and thereby bonded to each other so as to form bonding materials 5, and the crystal resonator plates 2 and the upper lid members 4 are bonded to each other with the bonding materials 5.

With the permanent bonding in the bonding step, the large number of upper lid members 4 and the large number of crystal resonator plates 2 are bonded to the one main surface 31 of the wafer 30. In this condition, wax is applied (not shown) so as to fill in the gaps between adjacent pairs of the upper lid members 3 and the crystal resonator plates 2, as in Embodiment 1. Thereafter, a wafer-like glass plate serving as a protective member is attached to the upper faces of the large number of upper lid members 3.

Figure 18:
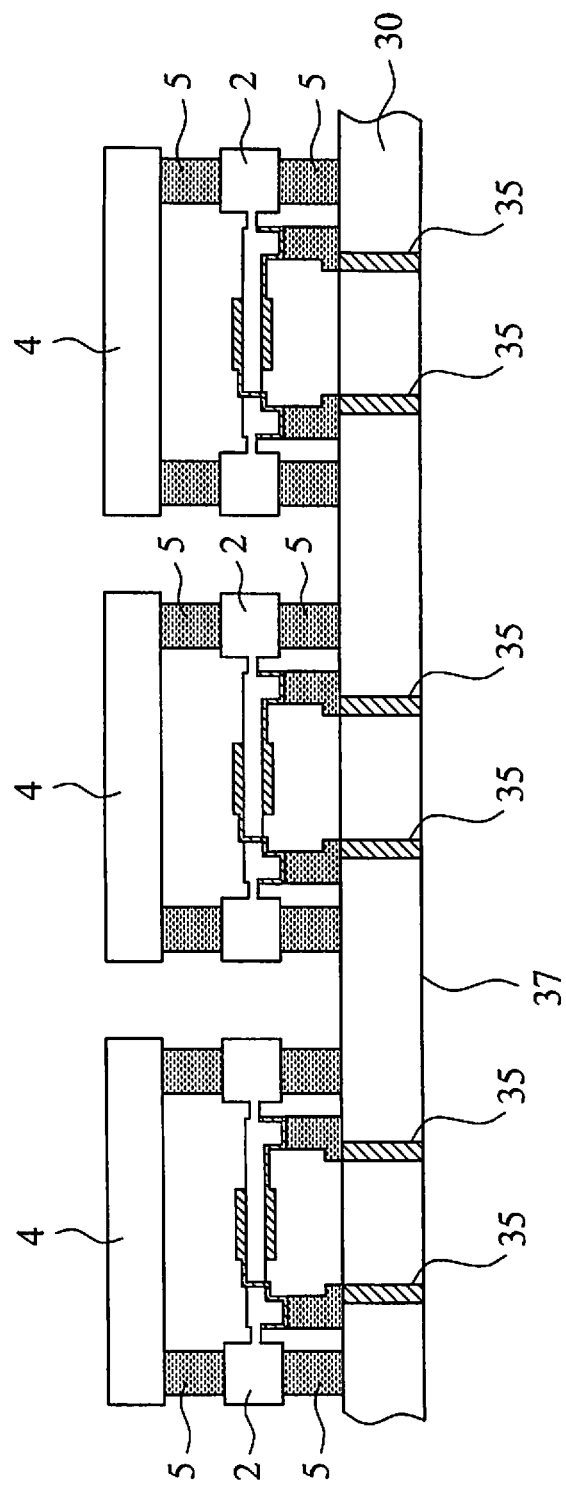
FIG. 18 is a schematic diagram showing the method for manufacturing crystal resonators according to Embodiment 2 of the present invention.
Figure 19:
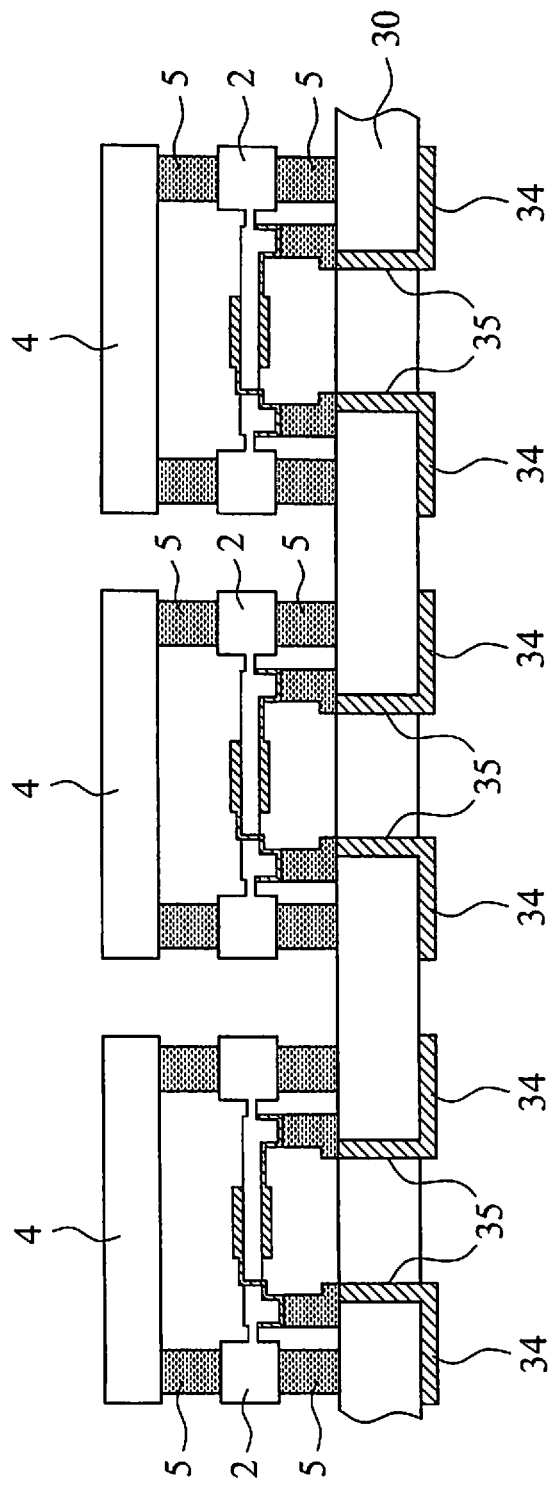
FIG. 19 is a schematic diagram showing the method for manufacturing crystal resonators according to Embodiment 2 of the present invention.
Figure 20:
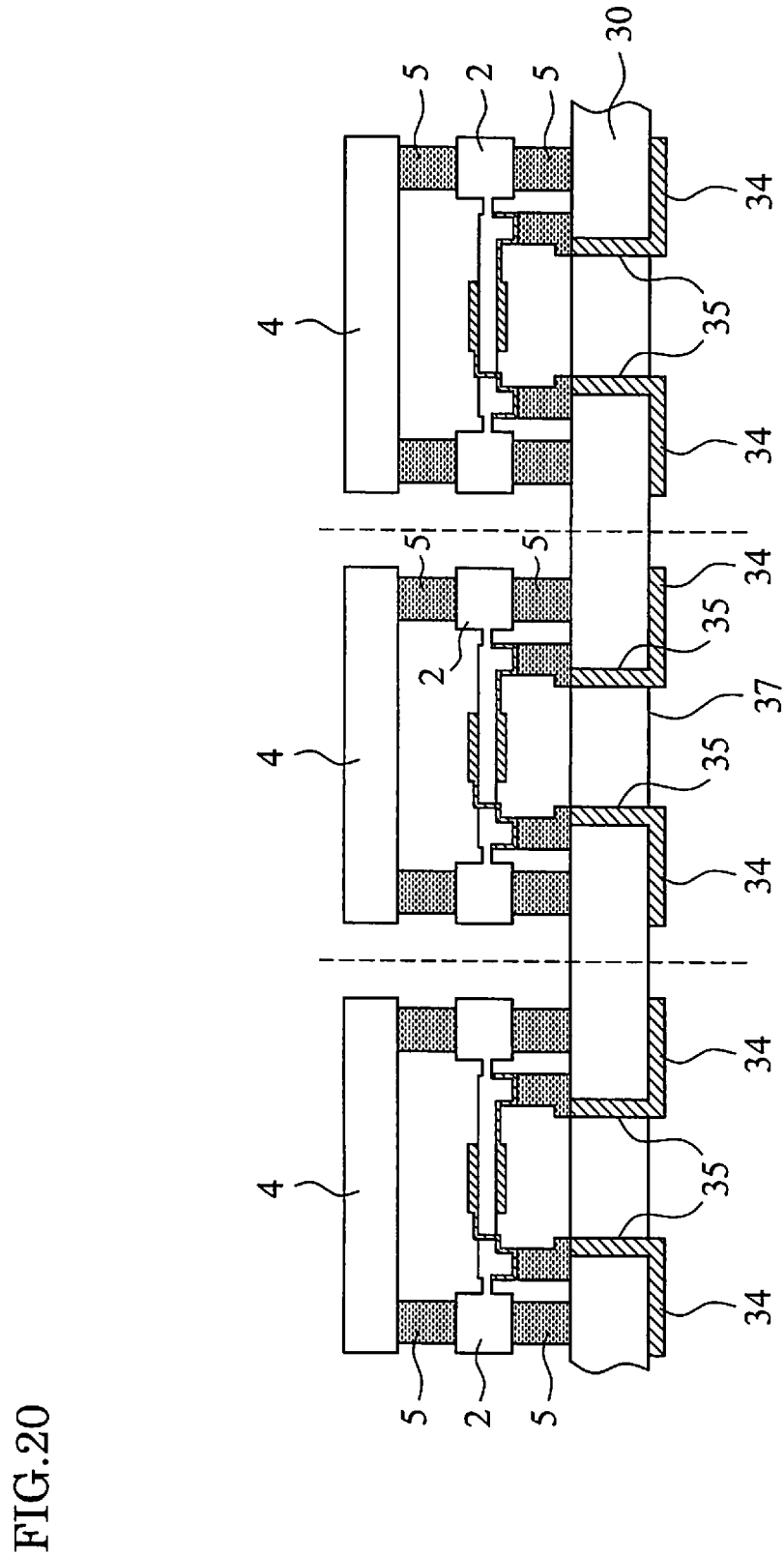
FIG. 20 is a schematic diagram showing the method for manufacturing crystal resonators according to Embodiment 2 of the present invention.
Figure 21:
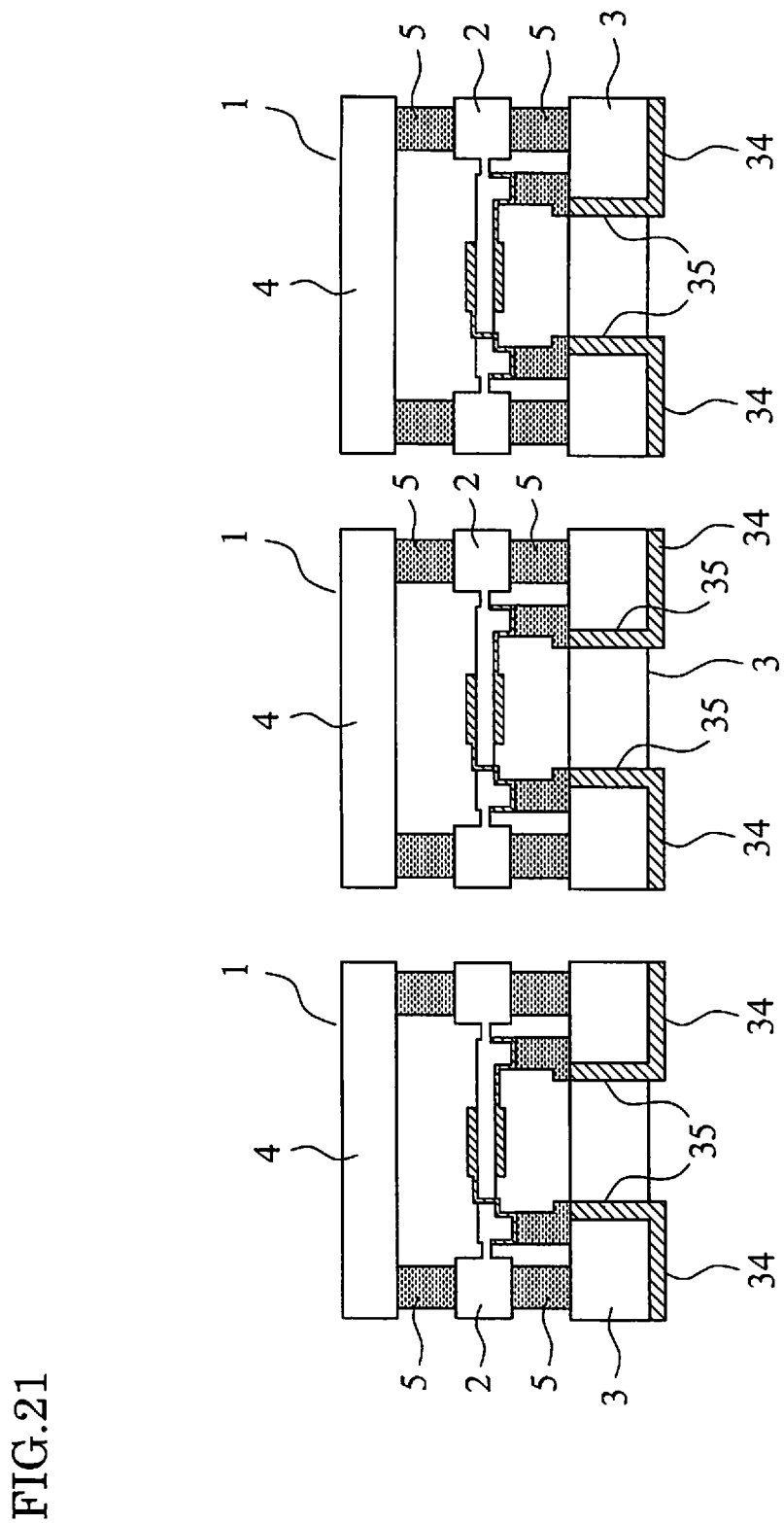
FIG. 21 is a schematic diagram showing the method for manufacturing crystal resonators according to Embodiment 2 of the present invention.

Next, as shown in FIG. 18, the wafer 30 protected by the wafer-like glass plate and the wax is thinned from the other main surface 37 side to the dotted line shown in FIG. 17 (until the vias 35 are exposed). The subsequent steps performed after the thinning step are similar to those of Embodiment 1. Specifically, as shown in FIG. 19, the external terminals 34 of Cr and Au are formed by vapor deposition on the thinned other main surface 37 side (external terminal forming step). Then, the aforementioned glass plate and wax are removed after the external terminal forming step. Thereafter, as shown in FIG. 20, the wafer 30 is cut by dicing in positions (dotted lines) that are substantially the centers between adjacent crystal resonators 1. By cutting the wafer in this way, a large number of crystal resonators 1 are simultaneously and collectively obtained as shown in FIG. 21 (dividing step).

As described above, with the manufacturing method according to Embodiment 2, the material to be mainly thinned is a single crystal material, so it is easy to thin the wafer by means such as wet etching and to manage the thinning step.

Furthermore, in Embodiments 1 and 2 described above, although the two flat-plate lid members (the lower lid member 3 and the upper lid member 4) that are rectangular in plan view are used, the present invention is not limited thereto, and the shape of the lid members may be set arbitrarily as long as the excitation electrodes 23 formed on the crystal resonator plates 2 can be hermetically sealed by the two lid members. For example, a configuration is possible in which recessed portions of two lid members that are recessed in cross section are hermetically bonded to each other while facing the crystal resonator plates 2.

Furthermore, in Embodiments 1 and 2, although the individual crystal resonator plates 2 and the individual upper lid members 4 are placed on a wafer-like integral form of the lower lid members 3 (the wafer 30), the present invention is not intended to be limited thereto, and both the crystal resonator plates 2 and the upper lid members 4 may be in the form of a wafer.

Figure 22:
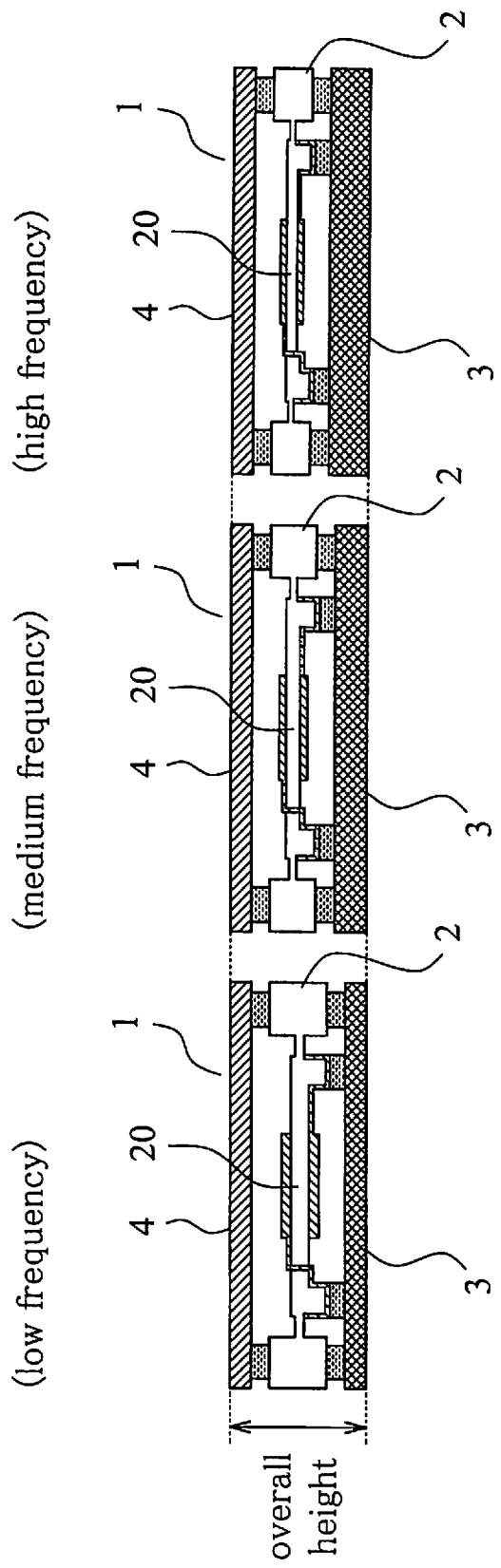
FIG. 22 shows a configuration example of crystal resonators having a low frequency band, a medium frequency band, and a high frequency band, respectively, according to Embodiments 1 and 2 of the present invention.

Note that, according to Embodiments 1 and 2, the thickness of the wafer (the lower lid members 3) prepared in the wafer forming step may be a constant thickness that is set in advance, and the amount of the thickness of the wafer to be thinned in the thinning step may vary in accordance with the thickness of the crystal resonator plates 2, as shown in FIG. 22. With this manufacturing method, for example in the case of using an AT-cut crystal plate for the crystal resonator plates 2, it is easy to size even crystal resonators 1 with different oscillation frequencies to the same overall height.

Specifically, since the oscillation frequency of the AT-cut crystal plate is inversely proportional to the thickness of the crystal resonator plates 2 (in particular, the vibration portions 20), the thickness of the crystal resonator plates 2 (in particular, the vibration portions 20) increases as the oscillation frequency decreases. For crystal resonators 1 with a configuration in which the crystal resonator plate 2 is sandwiched between the two lower and upper lid members 3 and 4, the thickness of the crystal resonator plates 2 is varied in accordance with the oscillation frequency. Accordingly, the overall height of the crystal resonators 1 will vary if the upper lid members 4 and the lower lid members 3 have the same distance to the crystal resonator plates 2. However, according to the above-described manufacturing methods according to Embodiments 1 and 2, the upper lid members 4 are formed to a constant thickness, and the lower lid members 3 (wafer) are formed to a thickness greater than the required maximum thickness, so that the overall height of the crystal resonators 1 can be made the same by varying the amount of the thickness of the lower lid members 3 to be thinned in accordance with the oscillation frequency.

For example, referring to three crystal resonators 1 shown FIG. 22, the left side of the figure shows a crystal resonator having a low frequency band, the center of the figure shows a crystal resonator having a medium frequency band, and the right side of the figure shows a crystal resonator having a high frequency band. In the crystal resonators 1 shown in FIG. 22, an AT-cut crystal resonator plate is used as a crystal resonator plate 2. Since the thickness of the crystal resonator plates 2 is inversely proportional to the oscillation frequency, it decreases from the left to the right side. Note that the thickness of the upper lid members 4 is constant irrespective of the frequency band. The thickness of the lower lid members 3 increases from the left to the right side in accordance with the thicknesses of the crystal resonator plates 2. By changing the amount of the thickness of the lower lid members 3 to be thinned in accordance with the oscillation frequency in this way, the overall height of the crystal resonators 1 can be made the same irrespective of the oscillation frequency. Accordingly, it is possible to standardize the thicknesses of the constituent members of the crystal resonators 1 and to thereby reduce the manufacturing cost.

Figure 23:
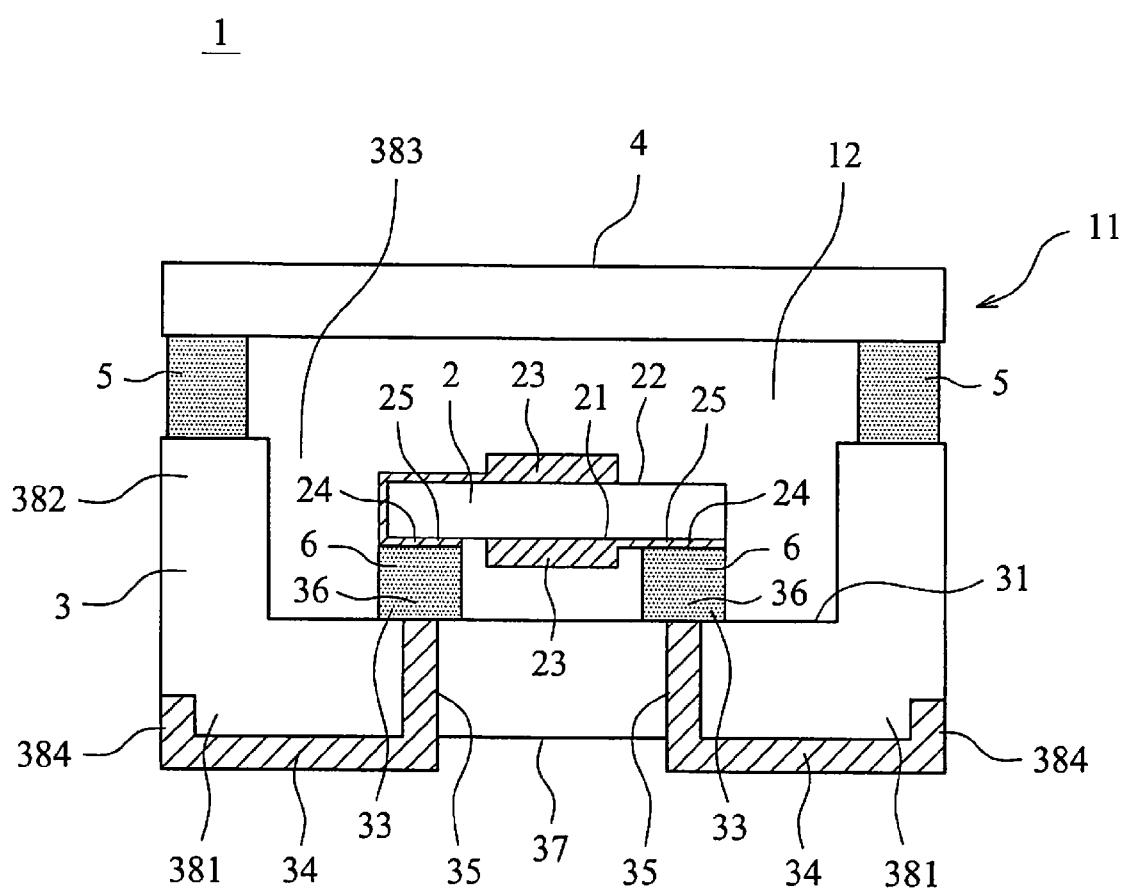
FIG. 23 is a cross-sectional schematic diagram of a crystal resonator illustrating Embodiment 3 of the present invention.

In Embodiments 1 and 2 described above, although the two flat-plate lid members (the lower lid member 3 and the upper lid member 4) that are rectangular in plan view are used, the present invention is not intended to be limited thereto, and a configuration is also possible in which a package 11 is made up of a single plate-like upper lid member 4 and a box-like lower lid member 3, and a crystal resonator plate 2 is placed on the lower lid member 3 in the package 11 and hermetically sealed thereon. Specifically, a crystal resonator 1 shown in FIG. 23 is possible. The crystal resonator 1 shown in FIG. 23 is described below as Embodiment 3.

Embodiment 3

Unlike Embodiments 1 and 2 described above, Embodiment 3 according to the present invention is such that the crystal resonator plate 2 is itself hermetically sealed by the upper lid member 4 and the lower lid member 3 as shown in FIG. 23. In Embodiment 3, the same reference numerals are given to constituent members that are similar to those of Embodiments 1 and 2, and descriptions of the constituent members and a manufacturing method that are similar to those of Embodiments 1 and 2 will be partly omitted herein. Furthermore, similar effects can also be achieved by constituent parts of the configuration and the manufacturing method of Embodiment 3 that are similar to those of Embodiments 1 and 2. Accordingly, the following description of Embodiment 3 focuses on differences from Embodiments 1 and 2.

A crystal resonator 1 according to Embodiment 3 includes, as shown in FIG. 23, a crystal resonator plate 2 made of an AT-cut crystal, a lower lid member 3 that holds the crystal resonator plate 2 and hermetically seals the crystal resonator plate 2, and an upper lid member 4 that hermetically seals the crystal resonator plate 2 held by the lower lid member 3. Note that the crystal resonator plate 2 may be other types of piezoelectric resonator plates such as a tuning fork-type crystal resonator plate.

In the crystal resonator 1, a package 11 is made up of the lower lid member 3 and the upper lid member 4 so as to form a single internal space 12 that is hermetically sealed by bonding the lower lid member 3 and the upper lid member 4 with the bonding material 5. In the internal space 12, the crystal resonator plate 2 is electromechanically bonded to the lower lid member 3 with ultrasonic waves by flip chip bonding (FCB) using conductive bumps 6.

Next is a description of constituent members of the crystal resonator 1 with reference to FIG. 23.

The lower lid member 3 is made of borosilicate glass containing a permeable material of Si and an additive, and is formed to have a box-like body made up of a bottom portion 381 and a wall portion 382 that extends upward from the bottom portion 381 along the outer periphery of the one main surface 31 of the lower lid member 3. The lower lid member 3 is formed by etching a single rectangular parallelepiped plate that is rectangular in plan view, using photolithography.

The top face of the wall portion 382 of the lower lid member 3 is a bonding face bonded to the upper lid member 4, and a third bonding material 53 (see FIG. 28) for bonding the upper lid member 4 is provided on the bonding face. The third bonding material 53 is formed by laminating multiple metal films in a bonding region, specifically, by forming from the lowermost layer side first a Cr layer (not shown) and then an Au layer (not shown) by vapor deposition and laminating thereon an Au flash plated layer (not shown).

The lower lid member 3 has a cavity 383 formed therein and surrounded by the bottom portion 381 and the wall portion 382, the cavity 383 being substantially rectangular in plan view. Furthermore, castellations 384 are formed at four corners of the casing back face (the other main surface 37) of the lower lid member 3. These castellations 384 are formed in the side faces of the casing at the four corners of the other main surface 37 of the lower lid member 3. The wall surfaces of the castellations 384 are formed to be curved surfaces.

The lower lid member 3 has further formed therein the second junction electrodes 33 (see FIG. 28) that are electromechanically bonded to the excitation electrodes 23 of the crystal resonator plate 2, the external terminals 34 that are electrically connected to external devices, and the electrode patterns 36 for providing connection between the second junction electrodes 33 and the external terminals 34. The second junction electrodes 33, the external terminals 34, and the electrode patterns 36 constitute an electrode of the lower lid member 3. The second junction electrodes 33 as used herein are formed simultaneously with the third bonding material 53, and are made of the same material as the third bonding material 53.

The lower lid member 3 has further formed therein vias 35 for continuity of the excitation electrodes 23 of the crystal resonator plate 2 in the cavity 383 to the outside of the cavity 383. The electrode patterns 36 are formed via these vias 35 from the second junction electrodes 33 on the one main surface 31 of the lower lid member 3 to the external terminals 34 on the other main surface 37.

The upper lid member 4 is made of borosilicate glass containing a permeable material of Si and an additive, and is formed to a single rectangular parallelepiped plate that is rectangular in plan view. The fourth bonding material 54 (see FIG. 30) bonded to the lid is provided on the underside of the upper lid member 4. The fourth bonding material 54 is configured by laminating multiple metal films in a bonding region, specifically, by forming from the lowermost layer side first a Cr layer (not shown) and then an Au layer 541 by vapor deposition, laminating thereon the Au—Sn alloy layer 542 (see FIG. 30), and further laminating thereon an Au flash plated layer (not shown).

The crystal resonator plate 2 is made of an AT-cut crystal substrate, and its external shape is a single rectangular parallelepiped plate that is substantially rectangular in plan view (its front and back main surfaces 21 and 22 are formed in a substantially rectangular shape).

The excitation electrodes 23 and the extraction electrodes 24 are formed on the crystal resonator plate 2. The excitation electrodes 23 are extracted by the extraction electrodes 24, and an Au-plated layer and an Au—Sn alloy layer that constitute the conductive bumps 6 are formed on the first junction electrodes 25 of the extraction electrodes 24.

In the crystal resonator 1 with the above-described configuration, the lower lid member 3 and the crystal resonator plate 2 are electromechanically bonded to each other via the conductive bumps 6 by FCB using ultrasonic waves. With this bonding, the excitation electrodes 23 of the crystal resonator plate 2 are electromechanically bonded to the second junction electrodes 33 of the lower lid member 3 via the first junction electrodes 25 of the extraction electrodes 24 and the conductive bumps 6, and accordingly the crystal resonator plate 2 is mounted on the lower lid member 3. Then, the upper lid member 4 is heated, melted, and thereby bonded to the lower lid member 3 with the crystal resonator plate 2 mounted thereon, via the third bonding material 53 and the fourth bonding material 54. Accordingly, the crystal resonator 1 with the crystal resonator plate 2 hermetically sealed is manufactured.

The above has been a description of the main constituent members of the crystal resonator 1.

Next is a description of a method for manufacturing such crystal resonators 1 according to Embodiment 3 with reference to FIGS. 24 to 33.

Figure 24:
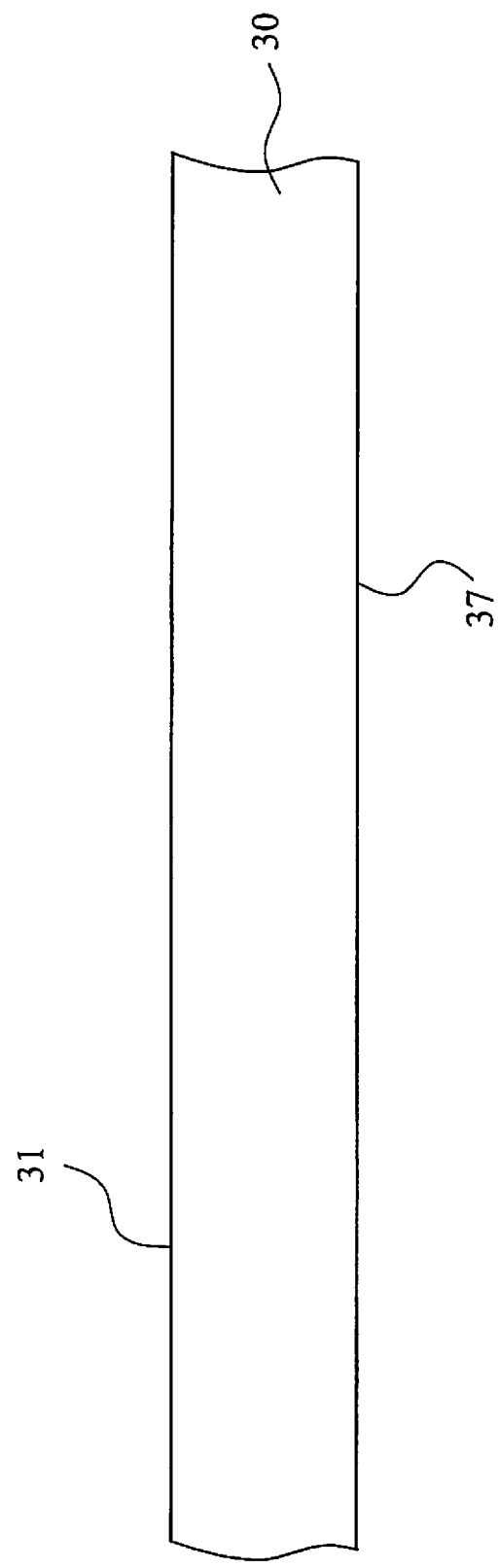
FIG. 24 is a schematic diagram showing a method for manufacturing crystal resonators according to Embodiment 3 of the present invention.

First, a thick-walled wafer 30 integrally formed with a large number of lower lid members 3 is prepared as shown in FIG. 24 (wafer forming step).

Figure 25:
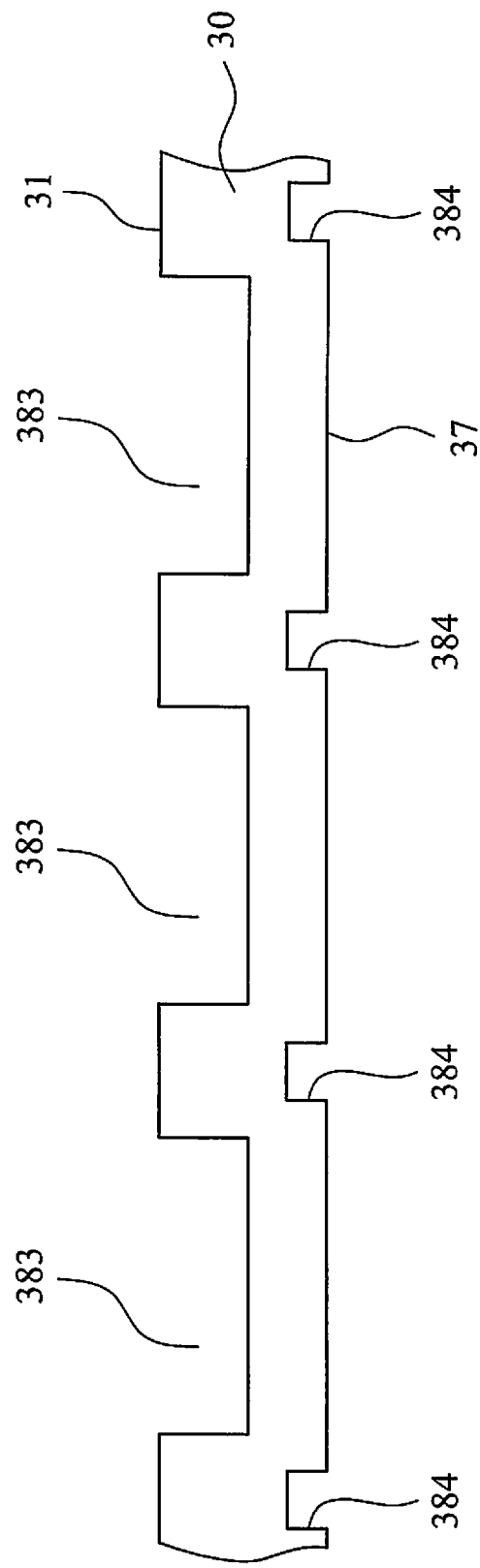
FIG. 25 is a schematic diagram showing the method for manufacturing crystal resonators according to Embodiment 3 of the present invention.

Next, as shown in FIG. 25, the external shape of the cavity 383 of each lower lid member 3 is formed in the one main surface 31 of the wafer 30, and the external shapes of the castellations 384 of each lower lid member 3 are formed in the other main surface 37 of the wafer 30, using photolithography.

Figure 26:
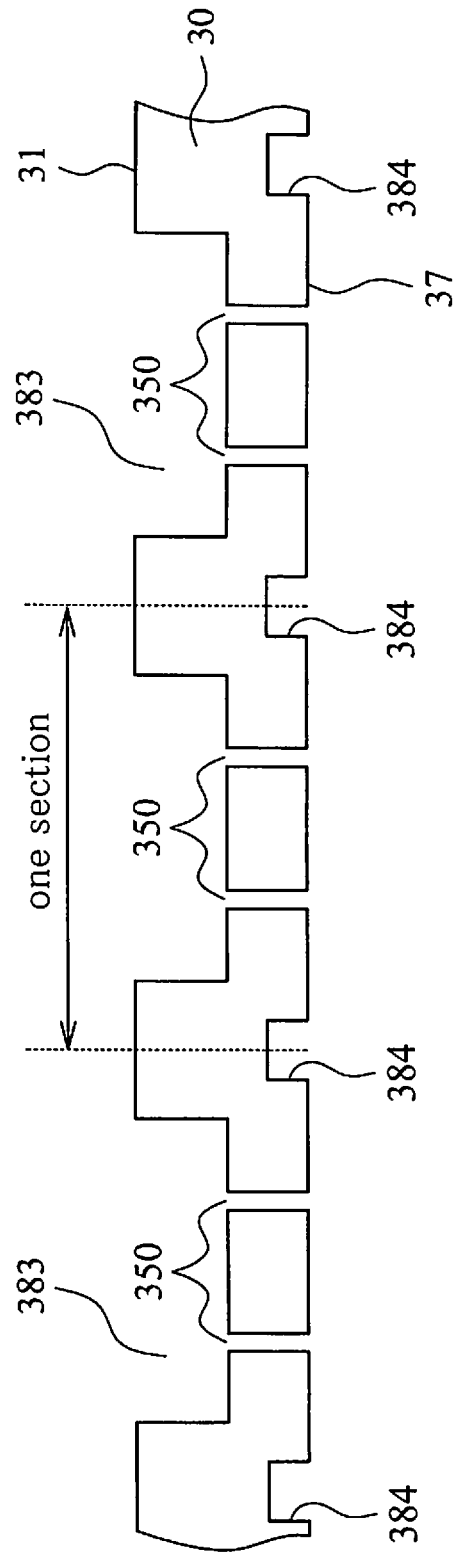
FIG. 26 is a schematic diagram showing the method for manufacturing crystal resonators according to Embodiment 3 of the present invention.

Next, as shown in FIG. 26, the multiple through holes 350 are formed by wet etching in predetermine positions in a region of the wafer 30 where each lower lid member 3 is formed (a region referred to as "one section" in FIG. 26).

Figure 27:
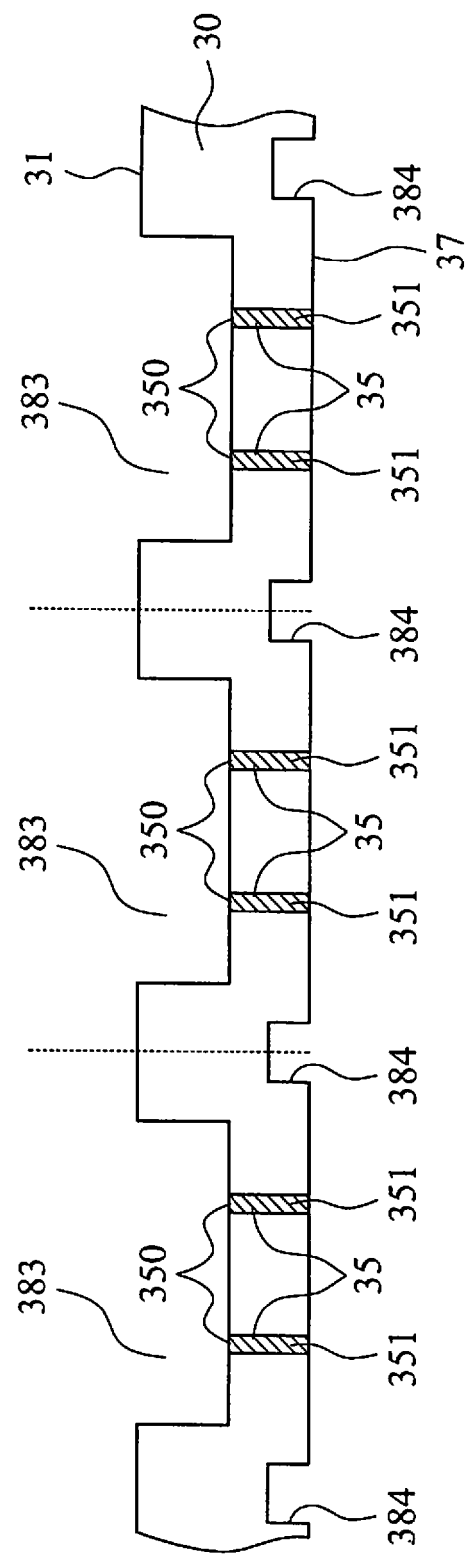
FIG. 27 is a schematic diagram showing the method for manufacturing crystal resonators according to Embodiment 3 of the present invention.

Then, the feedthrough conductors 351 are filled in the through holes 350 so as to form the vias 35 as shown in FIG. 27.

Figure 28:
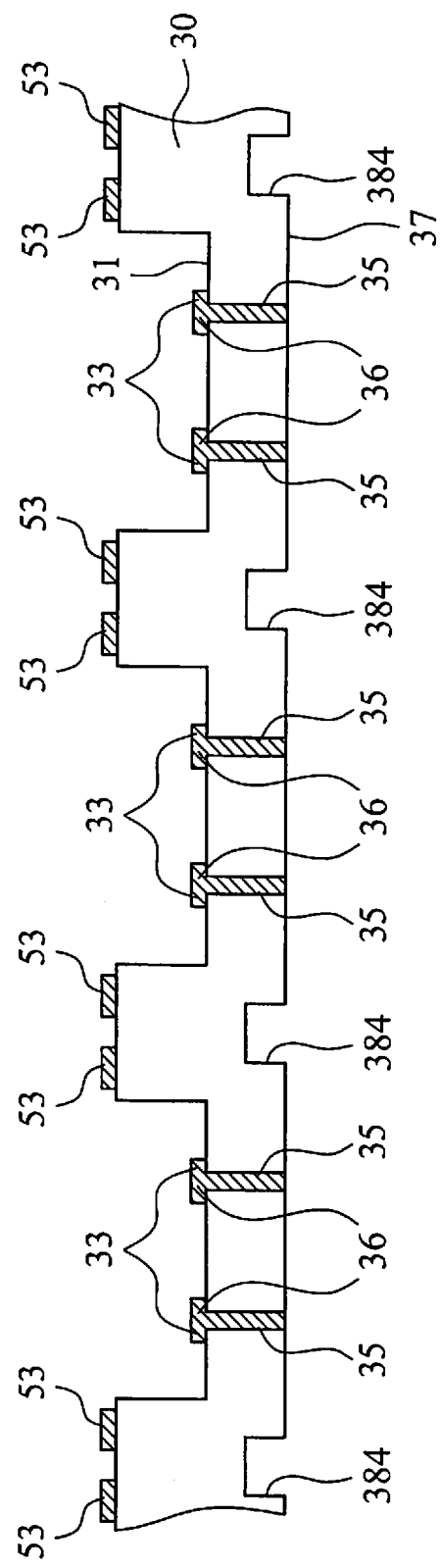
FIG. 28 is a schematic diagram showing the method for manufacturing crystal resonators according to Embodiment 3 of the present invention.

Next, as shown in FIG. 28, the third bonding material 53 is formed from a Cr layer (not shown), an Au layer, and an Au flash plated layer (not shown) by first forming the Cr layer, then forming the Au layer on the top of the Cr layer, and laminating the ultrathin Au flash plated layer on the Au layer on the one main surface 31 side of the wafer 30, specifically, in a region of each lower lid member 3 that is bonded to the crystal resonator plate 2 and in positions of each lower lid member 3 corresponding to the first junction electrodes 25 of the crystal resonator plate 2. The Au flash plated layer is also formed on the second junction electrodes 33 at the same time that it is formed on the Au layer.

Figure 29:
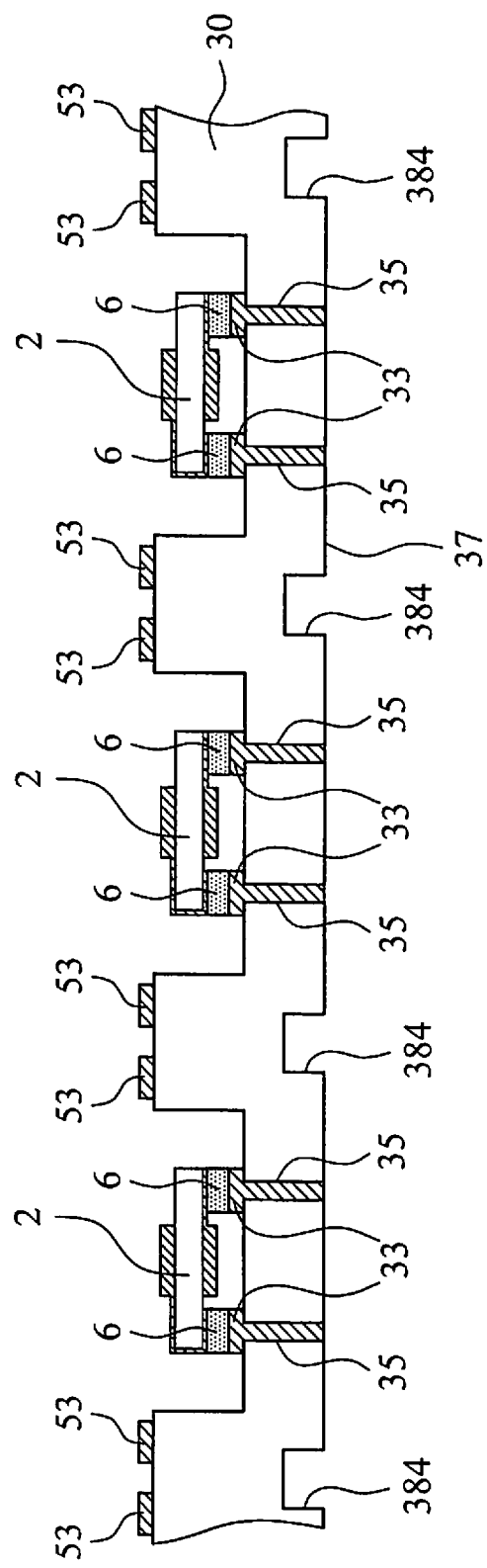
FIG. 29 is a schematic diagram showing the method for manufacturing crystal resonators according to Embodiment 3 of the present invention.

A large number of individual crystal resonator plates 2 are placed by image recognition means on the second junction electrodes 33 shown in FIG. 28, with the one main surfaces 21 of the crystal resonator plates 2 facing the one main surfaces 31 of the lower lid members 3 (see FIG. 29). Note that since the conductive bumps 6 are formed on the crystal resonator plates 2, the second junction electrodes 33 formed on the one main surfaces 31 of the lower lid members 3 and the conductive bumps 6 formed on the first junction electrodes 25 of the crystal resonator plates 2 are placed in substantially the same positions in plan view. After this alignment, ultrasonic waves are applied under pressure with an ultrasonic horn in contact with the crystal resonator plates 2. Accordingly, the first junction electrodes 25 of the crystal resonator plates 2 are bonded to the second junction electrodes 33 of the lower lid members 3 (part of the bonding step).

Figure 30:
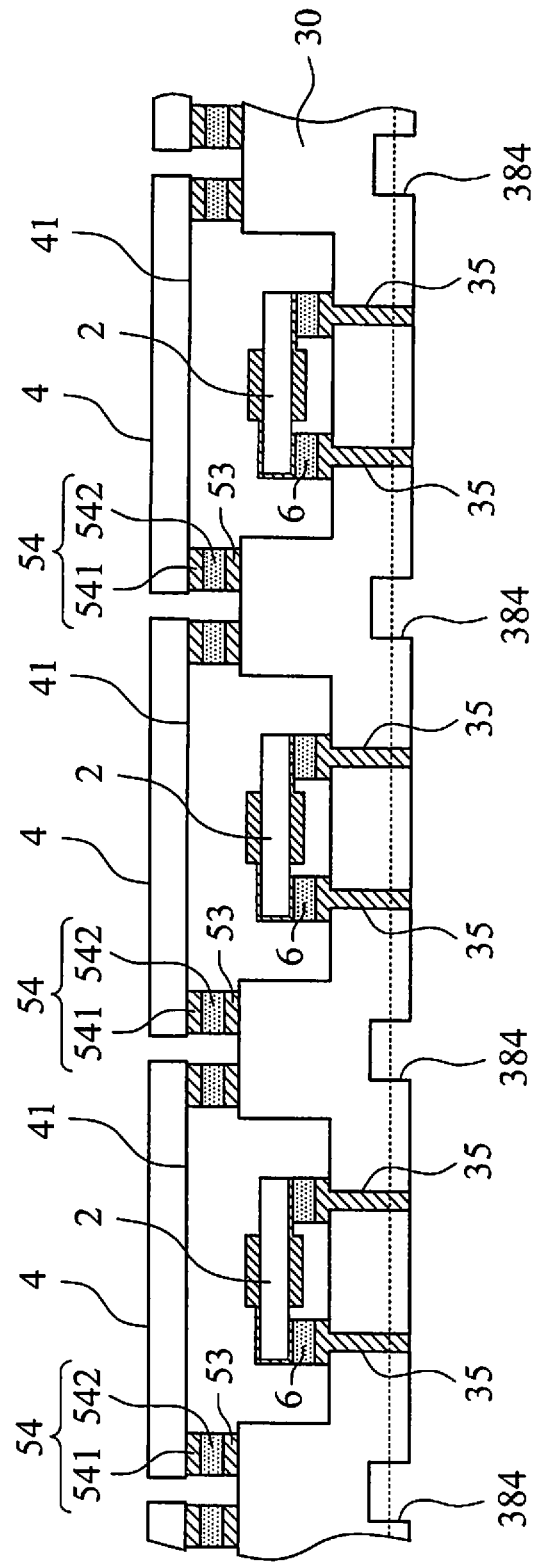
FIG. 30 is a schematic diagram showing the method for manufacturing crystal resonators according to Embodiment 3 of the present invention.

After the crystal resonator plates 2 have been electromechanically bonded to the wafer 30 (the lower lid members 3), individual upper lid members 4 are placed in positions on the wafer 30 that are set by image recognition means, with the one main surfaces 41 of the upper lid members facing the one main surface 31 of the wafer 30 (see FIG. 30). In this case, the third bonding material 53 formed on the one main surface of the wafer 30 and the fourth bonding materials 54 formed on the bonding surfaces (one main surfaces 41) of the upper lid members 4 are placed in substantially the same positions in plan view.

After the upper lid members 4 have been laminated on the lower lid members 3, the lower lid members 3 and the upper lid members 4 are temporarily bonded to each other with ultrasonic waves (part of the bonding step).

Next, the lower lid members 3 and the upper lid members 4, which have been temporarily bonded to each other, are placed in an environment where temperature is increased to a predetermined temperature and are permanently bonded to each other by melting the bonding materials (the third bonding materials 53 and the fourth bonding materials 54) formed on the lower and upper lid members (part of the bonding step). Specifically, the third bonding materials 53 and the fourth bonding materials 54 are bonded to each other so as to form the bonding materials 5, and the crystal resonator plates 2 and the lower lid members 3 are bonded to each other with the bonding materials 5. By bonding the crystal resonator plates 2 and the lower lid members 3 with the bonding materials 5, the crystal resonator plates 2 having the excitation electrodes 23 formed thereon are themselves hermetically sealed.

With the above permanent bonding, the large number of upper lid members 4 are bonded to the one main surface 31 of the wafer 30. In this condition, wax is applied so as to fill in the gaps between adjacent pairs of the upper lid members 3 and the crystal resonator plates 2 (not shown). Thereafter, a wafer-like glass plate (not shown) serving as a protective member is attached to the upper faces of the large number of upper lid members 3. In this case, the glass plate has substantially the same size as the wafer 30.

Figure 31:
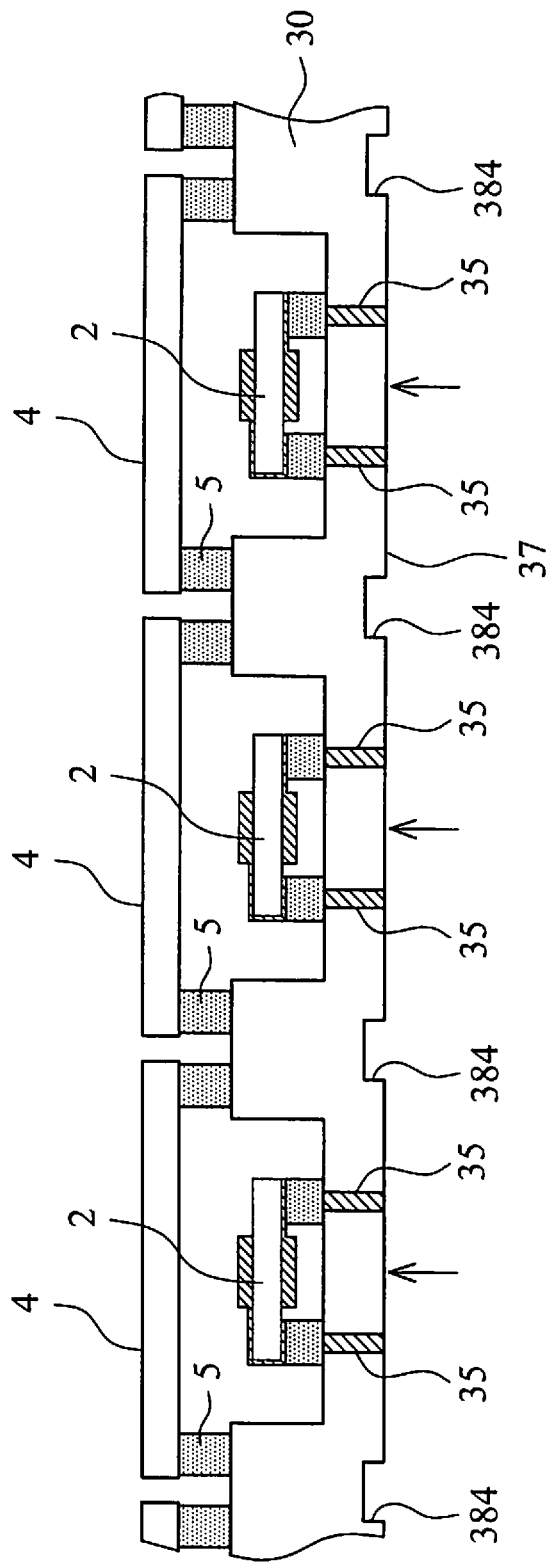
FIG. 31 is a schematic diagram showing the method for manufacturing crystal resonators according to Embodiment 3 of the present invention.

Next, the wafer 30 protected by the wafer-like glass plate and the wax is thinned from the other main surface 37 side as shown in FIG. 31 (thinning step). In this case, the amount of the thickness to be reduced is indicated by the dotted line shown in FIG. 30. In Embodiment 3, the wafer 30 is thinned by mechanical polishing. The present invention is, however, not intended to be limited thereto, and for example, the wafer 30 may be thinned by chemical mechanical polishing.

Figure 32:
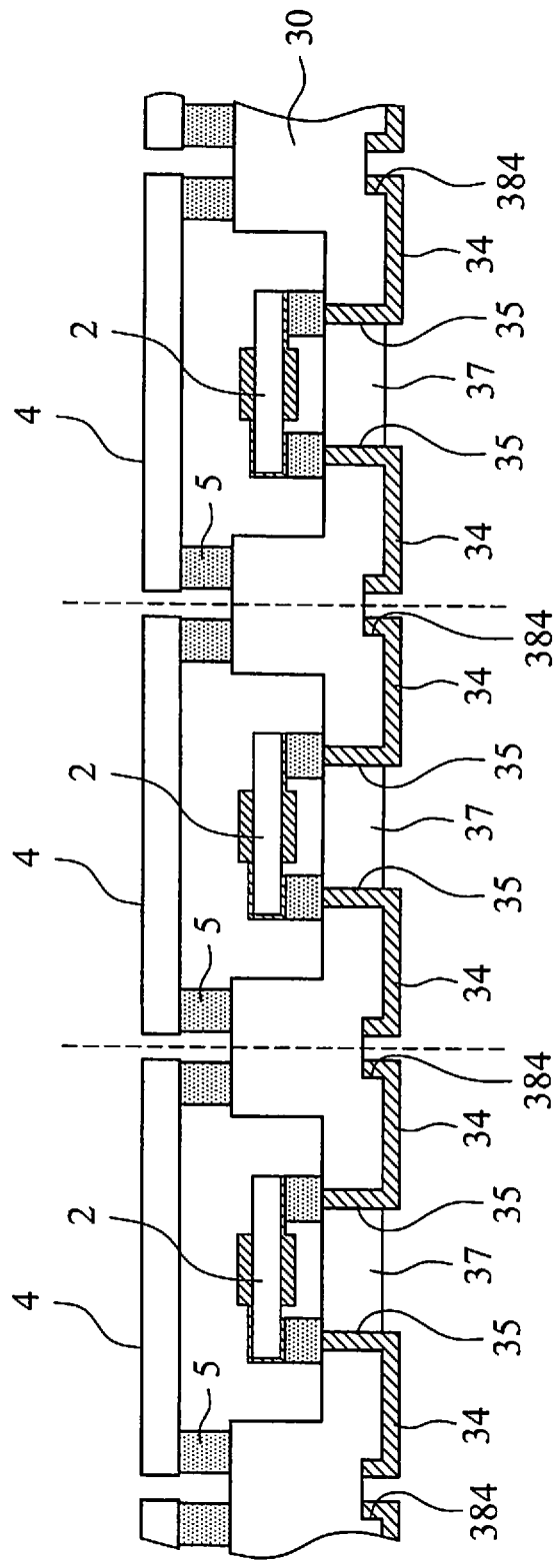
FIG. 32 is a schematic diagram showing the method for manufacturing crystal resonators according to Embodiment 3 of the present invention.

Then, the external terminals 34 are formed by vapor deposition on the other main surface 37 side of the thinned wafer 30 as shown in FIG. 32 (external terminal forming step). The external terminals 34 have a film configuration in which first a Cr layer and then an Au layer are laminated on the crystal. As shown in FIG. 32, the external terminals 34 are formed so as to be connected to the lower ends of the vias 35 (the other main surface 37 of the wafer 30) and are extracted to the castellations 384.

Figure 33:
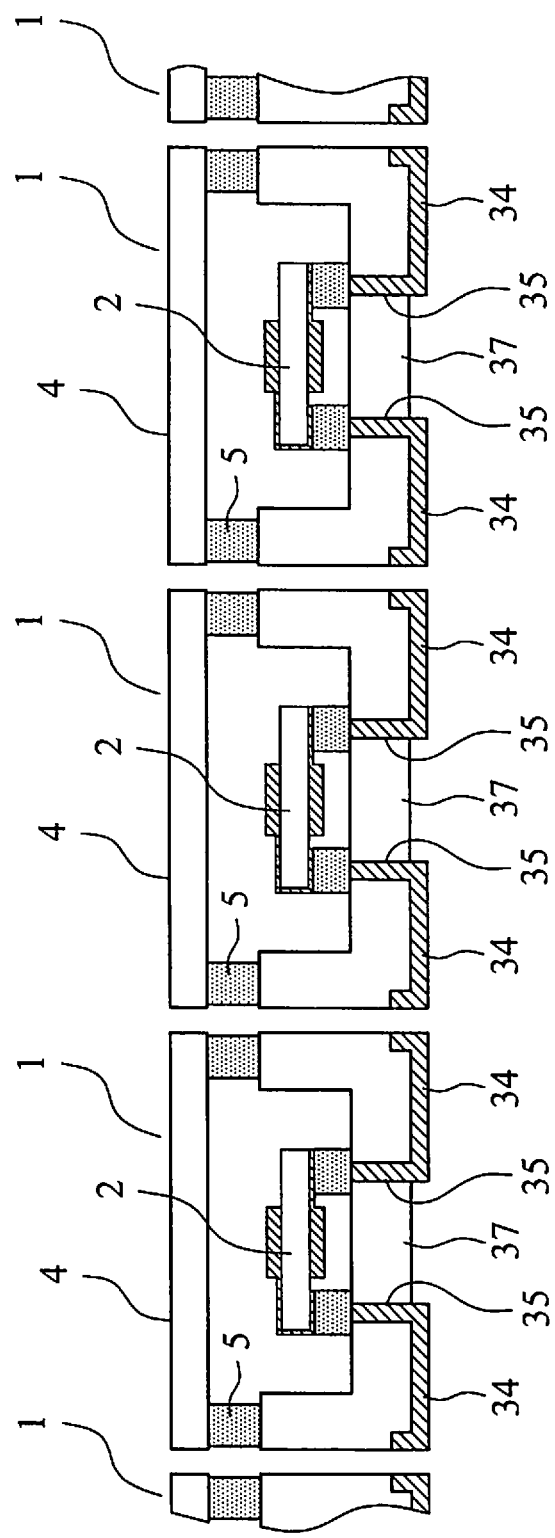
FIG. 33 is a schematic diagram showing the method for manufacturing crystal resonators according to Embodiment 3 of the present invention.

After the external terminal forming step, the aforementioned glass plate and wax are removed. Thereafter, the wafer 30 is cut in positions (indicated by the dotted lines in FIG. 32) that are substantially the centers between the adjacent crystal resonators 1 as shown in FIG. 32. Specifically, the wafer 30 is cut vertically and horizontally by dicing, using the dotted lines shown in FIG. 32 as a reference, and accordingly a large number of multiple crystal resonators 1 are simultaneously and collectively obtained as shown in FIG. 33 (dividing step).

According to Embodiment 3, since the manufacturing method includes the wafer forming step, the bonding step, the thinning step, the external terminal forming step, and the dividing step, similar effects to those of Embodiments 1 and 2 described above are achieved. Furthermore, since the thinning step is performed on the wafer 30 formed to have a box-like body in the wafer forming step, it is possible to suppress the influence of substrate deformation on the wafer 30 during formation of the wafer 30 and to thereby improve the precision of processing in forming the wafer 30.

In Embodiments 1 to 3 described above, although surface-mount crystal resonators are taken as an example, the present invention is also applicable to methods for manufacturing other surface-mount piezoelectric resonator devices used in electronic equipment or the like, such as crystal oscillators in which crystal resonators are incorporated into electronic components such as a crystal filter and an integrated circuit.

The present invention can be reduced to practice in various other forms without departing from its spirit or essential features. For this reason, the above-described exemplary embodiments are to all intents and purposes merely illustrative and should not be construed as limiting. The scope of the present invention is defined by the claims and is not in any way restricted by the descriptions of the specification. Furthermore, all variations and modifications of the claims within the scope of equivalency fall within the scope of the present invention.

This application claims prior right on the basis of Japanese Patent Application No. 2009-001796 filed in Japan on Jan. 7, 2009, the content of which is hereby incorporated in its entirety by reference herein.

INDUSTRIAL APPLICABILITY

The present invention is applicable to mass production of piezoelectric resonator devices.

The invention claimed is:

1. A method for manufacturing a piezoelectric resonator device including a piezoelectric resonator plate having an excitation electrode formed thereon, and upper and lower lid members that hermetically seal the excitation electrode, the upper lid member and the lower lid member being bonded to each other via a bonding material, the manufacturing method comprising:

a wafer forming step of preparing a thick-walled wafer that is integrally formed with a plurality of the lower lid members;

a bonding step of bonding the piezoelectric resonator plates to one main surfaces of the lower lid members of the wafer and bonding the upper lid members to the lower lid members;

a thinning step of thinning the wafer from the other main surface side of the wafer;

an external terminal forming step of forming external terminals on the other main surface side of the wafer, which has been thinned in the thinning step, the external terminals being electrically connected to the excitation electrodes; and a dividing step of cutting the wafer between each adjacent pair of the piezoelectric resonator devices so that a plurality of the piezoelectric resonator devices are obtained, and a process of filling closed-end holes with a conductor, which are formed from the one main surfaces of the lower lid members before the thinning step, wherein, in the thinning step, the wafer is thinned from the other main surface side of the wafer until the closed-end holes are exposed, and in the external terminal forming step, the external terminals are formed on the other main surface side of the thinned wafer so as to cover the closed-end holes.

2. The method for manufacturing piezoelectric resonator devices according to claim 1, wherein the wafer prepared in the wafer forming step is formed to a thickness that is set in advance, and an amount of the thickness of the wafer to be thinned in the thinning step is varied in accordance with a thickness of the piezoelectric resonator plates.

3. A method for manufacturing a piezoelectric resonator device including a piezoelectric resonator plate having an excitation electrode formed thereon, and upper and lower lid members that hermetically seal the excitation electrode, the upper lid member and the lower lid member being bonded to each other via a bonding material, the manufacturing method comprising:

a wafer forming step of preparing a thick-walled wafer that is integrally formed with a plurality of the lower lid members;

a bonding step of bonding the piezoelectric resonator plates to one main surfaces of the lower lid members of the wafer and bonding the upper lid members to the lower lid members;

a thinning step of thinning the wafer from the other main surface side of the wafer;

an external terminal forming step of forming external terminals on the other main surface side of the wafer, which has been thinned in the thinning step, the external terminals being electrically connected to the excitation electrodes; and a dividing step of cutting the wafer between each adjacent pair of the piezoelectric resonator devices so that a plurality of the piezoelectric resonator devices are obtained, wherein the wafer prepared in the wafer forming step is formed to a thickness that is set in advance, and an amount of the thickness of the wafer to be thinned in the thinning step is varied in accordance with a thickness of the piezoelectric resonator plates.

* * * * *